(12) United States Patent
Yeh et al.

(10) Patent No.: US 10,763,409 B2
(45) Date of Patent: Sep. 1, 2020

(54) LED LIGHT SOURCE, LED LIGHT SOURCE MANUFACTURING METHOD, AND DIRECT DISPLAY DEVICE THEREOF

(71) Applicant: UNITY OPTO TECHNOLOGY CO., LTD., New Taipei (TW)

(72) Inventors: Hung-Li Yeh, New Taipei (TW); Wei-Chung Lin, New Taipei (TW); Ko-Wei Lu, New Taipei (TW)

(73) Assignee: UNITY OPTO TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 16/510,995

(22) Filed: Jul. 15, 2019

(65) Prior Publication Data
US 2019/0355883 A1    Nov. 21, 2019

Related U.S. Application Data

(62) Division of application No. 16/055,277, filed on Aug. 6, 2018.

(30) Foreign Application Priority Data

May 15, 2018    (TW) .............................. 107116481 A

(51) Int. Cl.
| | | |
|---|---|---|
| *H01L 33/54* | (2010.01) | |
| *H01L 33/50* | (2010.01) | |
| *G09G 3/32* | (2016.01) | |
| *G09G 3/20* | (2006.01) | |
| *H01L 33/48* | (2010.01) | |

(52) U.S. Cl.
CPC ............ *H01L 33/54* (2013.01); *G09G 3/2003* (2013.01); *G09G 3/32* (2013.01); *H01L 33/486* (2013.01); *H01L 33/50* (2013.01); *G09G 2320/0233* (2013.01)

(58) Field of Classification Search
CPC ....... H01L 33/54; H01L 33/50; H01L 33/486; G09G 3/32; G09G 3/2003; G09G 2320/0233
See application file for complete search history.

(56) References Cited

U.S. PATENT DOCUMENTS

| | | | | |
|---|---|---|---|---|
| 6,480,389 B1* | 11/2002 | Shie | ....................... | H01L 33/58 257/E33.073 |
| 2009/0039369 A1* | 2/2009 | Niino | ...................... | H01L 33/54 257/98 |
| 2010/0025709 A1* | 2/2010 | Koseki | .................... | H01L 33/56 257/98 |
| 2010/0277887 A1* | 11/2010 | Su | ........................... | H01L 33/44 362/19 |
| 2012/0007119 A1* | 1/2012 | Shiobara | ................. | H01L 33/44 257/98 |

(Continued)

*Primary Examiner* — Sitaramarao S Yechuri
(74) *Attorney, Agent, or Firm* — Fei-hung Yang

(57) ABSTRACT

Disclosed are an LED light source, an LED light source manufacturing method, and their direct display device. The LED light source includes a base, at least an LED chip, an anti-vulcanization structure, a light excitation structure, an encapsulation structure and a protection structure. The LED light source can overcome catalyst poison or vulcanization of the light-emitting material effectively to improve product yield and reliability of the LED light source. In the meantime, the LED light source has the feature of a better light emission performance.

22 Claims, 11 Drawing Sheets

(56) References Cited

U.S. PATENT DOCUMENTS

| | | | |
|---|---|---|---|
| 2012/0068187 A1* | 3/2012 | Odnoblyudov | H01L 33/508 257/76 |
| 2015/0226400 A1* | 8/2015 | Wada | G02F 1/133611 362/97.1 |
| 2015/0340346 A1* | 11/2015 | Chu | H01L 25/0753 257/89 |
| 2016/0181482 A1* | 6/2016 | Borrelli | H01L 33/505 257/98 |
| 2016/0190410 A1* | 6/2016 | Kromotis | H01L 33/44 257/99 |
| 2017/0062678 A1* | 3/2017 | Butterworth | H01L 33/505 |
| 2017/0309796 A1* | 10/2017 | Oh | C09K 11/7734 |
| 2018/0212118 A1* | 7/2018 | Chen | H01L 33/508 |
| 2018/0341055 A1* | 11/2018 | Yuan | G02F 1/133603 |
| 2019/0169376 A1* | 6/2019 | Hein | C08L 67/00 |

\* cited by examiner

LED LIGHT SOURCE, LED LIGHT SOURCE MANUFACTURING METHOD, AND DIRECT DISPLAY DEVICE THEREOF

CROSS-REFERENCE TO RELATED APPLICATIONS

This application is a divisional patent application of U.S. application Ser. No. 16/055,277 filed on Aug. 6, 2018, the entire contents of which are hereby incorporated by reference for which priority is claimed under 35 U.S.C. § 120.

FIELD OF INVENTION

The present disclosure relates to the field of light emitting diodes (LEDs), in particular to an LED light source, an LED light source manufacturing method, and their direct display device capable of improving the yield of packaging and having excellent anti-moisture, anti-oxidation, and anti-vulcanization effects.

BACKGROUND OF INVENTION

Description of the Related Art

As technologies advance, Light Emitting Diode (LED) is used extensively in light source products, and related manufacturers constantly conduct research and development to improve the performance, efficiency and service life of the LED.

A conventional LED 9 generally comprises an LED chip 91 installed on a base 90 and a light-emitting material 92 provided for packing the LED chip 91 to form a light emitting source for the purpose of illumination and display. After the light of the chip and the light formed by exciting the light-emitting material are mixed, the required light such as a white light is formed as shown in FIG. 11. According to the difference of output requirements, the selected light-emitting material packaged into the LED varies. In general, an LED light source used for displays requires the use of a light-emitting material with a narrower half-wavelength width to improve the color purity of the display device in order to provide a display with a wider color gamut.

Regardless of the LED applications, the color temperature, color rendering index, color gamut/color saturation, and light emission brightness of the LED have their defined specifications. Therefore, related manufacturers design and develop the aforementioned components to provide a more superior LED with better performance. For example, R.O.C. Pat. Publication No. 1453957 has disclosed a technology of using a glass encapsulator to cover the top of a substrate instead, and separating the LED chip from the glass encapsulator to produce an LED light source with better performance. Further, R.O.C. Pat. Publication No. 1586001 has provided an ultraviolet LED package structure specifically for the focusing on the ultraviolet LED having no light-emitting material to provide a filler for a reflective housing, wherein the filler is an UV resistant inorganic material, so that the ultraviolet provides a high reflectivity and the ultraviolet LED package structure has the features of good performance and lower cost.

In addition, the light-emitting material packaged in the LED usually has the following problems. Since most light-emitting materials generally use metal ions as an activator, and the metal ions may be oxidized very easily when they are in contact with water, and water or oxidation may change the valence of the metal ions, so that the fluorescent powder loses the light excitation function. For example, the original ion $Eu^{2+}$ is changed into $Eu^{3+}$, and the ion valence is incorrect, or the light emitting quantum dot material is reacted with water and oxygen, and the nanostructure is changed into the microstructure, so that the light-emitting material excited by the LED chip will not emit light, and the light-emitting material loses the light excitation function, and the LED cannot provide the required light successfully.

In actual practices, the light-emitting material packaged into the LED is affected by composition besides the aforementioned LED package and production problems. In a conventional LED packaging process, the metal reflective layer of LED may become black and lose the light reflection function, and the brightness of the LED light source drops. On the other hand, the packaging material contacted with the light-emitting material also has a catalyst poison, so that when the packaging material is baked and cured, the catalyst poison material and the packaging material will be volatilized, and the packaging material will be poisoned, hardened and incomplete. Obviously, the conventional LED technology still cannot overcome the aforementioned drawbacks effectively.

In view of the aforementioned drawbacks, the disclosurer of this disclosure provides an LED light source, an LED light source manufacturing method and their direct display device, in hope of overcoming the issues of the blackening and catalyst poisoning of the light-emitting material to improve the service life and light output performance of the LED light source.

SUMMARY OF THE INVENTION

Therefore, it is a primary objective of the present disclosure to provide an LED light source, an LED light source manufacturing method, and their direct display device, and such disclosure can overcome the aforementioned issues of the catalyst poison or vulcanization of the light-emitting material effectively to improve the product yield and reliability of the LED light source, and the LED light source has the feature of a better light emission performance.

To achieve the aforementioned and other objectives, the present disclosure provides an LED light source comprising: a base, having an upper edge, a light emitting region formed and enclosed by the upper edge, an inner mounting surface concavely formed on the base and inwardly along the upper edge, and a reflective layer disposed on the inner mounting surface; at least an LED chip, installed at a bottom position of the inner mounting surface by a flip chip method; an anti-vulcanization structure, continuously and uninterruptible formed on the reflective layer and a surface of the LED chip; a light excitation structure, including at least a fluorescent powder containing an element selected from the group consisting of sulfur, lead, and phosphorus, and the light excitation structure being disposed in the base; an encapsulation structure, disposed in the base and provided for packaging the light excitation structure and the LED chip into the base, and the anti-vulcanization structure isolating the reflective layer and the LED chip from directly contacted with the encapsulation structure, and the encapsulation structure being made of organic silicone and containing a platinum catalyst; and a protection structure, installed to the base by a dispensing method and covering the encapsulation structure; wherein the encapsulation structure has a hardness lower than the hardness of the protection structure. The complete protection provided by the anti-vulcanization structure can effectively prevent the metal material in the base from having any vulcanization and provide a perfect LED packaging performance. The protection structure also enhances the effect of isolating moisture and oxygen from the whole LED light source sufficiently to provide better light emission efficiency.

Preferably, when the LED chip is installed by the flip chip method, the encapsulation structure has a hardness preferably falling within a range of D40-D60 to provide a good packaging effect. The protection structure with a hardness falling within a range of D60-D80 provides the effect of isolating the moisture and oxygen.

In another embodiment, this disclosure also discloses an LED light source, comprising: a base, having an upper edge, a light emitting region formed and enclosed by the upper edge, an inner mounting surface inwardly and concavely formed on the base along the upper edge, and a reflective layer disposed on the inner mounting surface; at least an LED chip, combined with two metal wire bonds and installed at a bottom position of the inner mounting surface by a flip chip method; an anti-vulcanization structure, continuously and uninterruptible formed on the reflective layer, the metal wire bonds and a surface of the LED chip; a light excitation structure, including at least a fluorescent powder containing an element selected from the group consisting of sulfur, lead, and phosphorus, and the light excitation structure being disposed in the base; an encapsulation structure, disposed in the base and provided for packaging the light excitation structure and the LED chip into the base, and the anti-vulcanization structure isolating the reflective layer, the metal wire bonds and the LED chip from directly contacting with the encapsulation structure, and the encapsulation structure being made of organic silicone and containing a platinum catalyst; and a protection structure, installed to the base by a dispensing method and covering the encapsulation structure; wherein the encapsulation structure has a hardness lower than the hardness of the protection structure. The complete protection provided by the anti-vulcanization structure can effectively prevent the metal material in the base from having any vulcanization and provide a perfect LED packaging performance. The protection structure also enhances the effect of isolating moisture and oxygen from the whole LED light source to provide better light emission efficiency.

Preferably, when the LED chip is combined with two metal wire bonds and installed at the bottom position of the inner mounting surface by a flip chip method, the encapsulation structure has a hardness preferably falling within a range of D20-D40 to provide a good packaging effect. The protection structure with a hardness falling within a range of D60-D80 provides the effect of isolating moisture and oxygen sufficiently. In addition, the anti-vulcanization structure with a thickness falling within a range of 2-10 µm can prevent losing the performance of isolating the reflective layer from the encapsulation structure due to a too-thin anti-vulcanization structure, or prevent damaging the metal wire bonds during the thermal expansion stress test due to a too-thick anti-vulcanization structure.

This disclosure also provides an LED light source manufacturing method, comprising the steps of: providing a base having an upper edge, a light emitting region formed and enclosed by the upper edge, and an inner mounting surface inwardly and concavely formed on the base along the upper edge; forming a reflective layer on the inner mounting surface; providing at least an LED chip installed at a bottom position of the inner mounting surface by a flip chip method or combining two metal wire bonds by a solid crystallization method; injecting a low-viscosity and high-volatilization anti-vulcanization solvent to the inner mounting surface of the base, so that the anti-vulcanization solvent completely covers all metal materials on the inner mounting surface; resting or heating to volatize the anti-vulcanization solvent to form an anti-vulcanization structure, and the anti-vulcanization structure being in a continuous and uninterruptible thin film state; providing a light excitation structure including at least a fluorescent powder containing one selected from the group consisting of sulfur, lead, and phosphorus, and the light excitation structure being installed in the base; packaging the light excitation structure and the LED chip by an encapsulation structure, and the anti-vulcanization structure isolating all metal materials on the inner mounting surface from directly contacting with the encapsulation structure, and the encapsulation structure being made of organic silicone and containing a platinum catalyst; and dispensing a protection structure to the base and covering the encapsulation structure; wherein the encapsulation structure has a hardness lower than the hardness of the protection structure. This method can effectively prevent sulphur from being chemically reacted with the metal material or encapsulation structure during the packaging process or resulting in an incomplete packaging. This method also improves the reliability and performance of the manufactured LED light source.

When the anti-vulcanization solvent is heated and volatilized during the process of forming the anti-vulcanization structure, the heating temperature is preferably lower than 150° C. to prevent producing air bubbles or cracked films caused by a too-high temperature or a too-slow discharge of the volatile gas and a solidified film, after the anti-vulcanization structure is formed.

This disclosure also provides an application of the LED light source. In an embodiment, a direct display device comprises: a display module, for displaying a screen; and a backlight module, installed on a side of the display module, and comprising: a circuit board; and a plurality of LED light sources, installed on the circuit board, and the LED light soruces comprise: a base, having an upper edge, a light emitting region formed and enclosed by the upper edge, an inner mounting surface inwardly and concavely formed on the base along the upper edge, and a reflective layer disposed on the inner mounting surface; at least an LED chip, installed at a bottom position of the inner mounting surface by a flip chip method; an anti-vulcanization structure, continuously and uninterruptible formed on the reflective layer and a surface of the LED chip; a light excitation structure, including at least a fluorescent powder containing an element selected from the group consisting of sulfur, lead, and phosphorus, and the light excitation structure being disposed in the base; an encapsulation structure, disposed in the base and provided for packaging the light excitation structure and the LED chip into the base, and the anti-vulcanization structure isolating the reflective layer and the LED chip from directly contacting with the encapsulation structure, and the encapsulation structure being made of organic silicone and containing a platinum catalyst; and a protection structure, installed to the base by a dispensing method and covering the encapsulation structure; wherein the encapsulation structure has a hardness lower than the hardness of the protection structure. Therefore, the direct display device has better light emission performance and color rendering and can effectively reduce the quantity of LED light sources in the application.

This disclosure also provides an application of the LED light source. In an embodiment, this disclosure discloses a direct display device, comprising: a display module, for displaying a screen; and a backlight module, installed on a side of the display module, and comprising: a circuit board; a plurality of LED light sources, installed on the circuit board, and comprising: a base, having an upper edge, a light emitting region formed and enclosed by the upper edge, an inner mounting surface inwardly and concavely formed on the base along the upper edge, and a reflective layer disposed on the inner mounting surface; at least an LED chip, combined with two metal wire bonds and installed at a bottom position of the inner mounting surface by a flip chip method; an anti-vulcanization structure, continuously and uninterruptible formed on the reflective layer, the metal wire bonds, and a surface of the LED chip; a light excitation structure, including at least a fluorescent powder containing an element selected from the group consisting of sulfur, lead, and phosphorus, and the light excitation structure being disposed in the base; an encapsulation structure, disposed in the base and provided for packaging the light excitation structure and the LED chip into the base, and the anti-vulcanization structure isolating the reflective layer, the metal wire bonds, and the LED chip from directly contacting with the encapsulation structure, and the encapsulation structure being made of organic silicone and containing a platinum catalyst; and a protection structure, installed to the base by a dispensing method and covering the encapsulation structure; wherein the encapsulation structure has a hardness lower than the hardness of the protection structure.

In another embodiment based on the aforementioned embodiments, this disclosure provides an LED light source further comprising: a plurality of uniform light particles, scattered into the protection structure, and the uniform light particles being one selected from the group consisting of $SiO_2$, BN, $Al_2O_3$, and $TiO_2$ or a combination thereof. Therefore, the uniformity of the light color distribution of the LED light source can be improved.

Preferably, the uniform light particle relative to the protection structure has a weight percentage concentration falling within a range of 5%-15% in order to meet the requirements for the uniform light color distributon and the brightness of the light emission.

Preferably, the protection structure is made of a material selected from organic silicone, and the corresponding encapsulation structures form a better bonding strength and provide a more uniform light to present possible optical issues such as refractions caused by heterostructures.

In an embodiment, the protection structure is installed at the upper edge of the base by a dispensing method and the protection structure has an area greater than the area of the light emitting region to improve the supporting force of the protection structure relative to the base. Further, the upper edge of the base is formed into a stepped shape. In addition, the base is made of a transparent material to achieve a multi-directional light output effect.

In a preferred embodiment, the LED chip has a chip light emission wavelength falling within a range of 400-460 nm, and the light excitation structure comprises a green fluorescent powder and a first red fluorescent powder, and the green fluorescent powder contains sulfur, and the first red fluorescent powder does not contain sulfur; and the first red fluorescent powder is selected from the group consisting of $T_2XF_6:Mn^{4+}$, $M_2Si_5N_8:Eu^{2+}$, and $CaAlSiN_3:Eu^{2+}$; T is selected from the group consisting of Li, Na, K, and Rb, and X is selected from the group consisting of Ge, Si, Sn, Zr, and Ti; M is selected from the group consisting of Ca, Sr, and Ba. These are mixed to form a white light.

In another embodiment, the LED chip has a chip light emission wavelength falling within a range of 400-460 nm, and the light excitation structure comprises a green fluorescent powder and a second red fluorescent powder, and the green fluorescent powder contains sulfur, and the second red fluorescent powder also contains sulfur; and the second red fluorescent powder is selected from the group consisting of $CaS:Eu^{2+}$, $SrS:Eu^{2+}$, $Ba_2ZnS_3:Mn^{2+}$, and a red quantum dot. These are mixed to form a white light.

In another embodiment, the LED chip has a light emission wavelength falling within a range of 400-460 nm, and the light excitation structure comprises a green fluorescent powder, a first red fluorescent powder and a second red fluorescent powder, and the green fluorescent powder contains sulfur, and the first red fluorescent powder does not contain sulfur, and the second red fluorescent powder contains sulfur; and the first red fluorescent powder is selected from the group consisting of $T_2XF_6:Mn^{4+}$, $M_2Si_5N_8:Eu^{2+}$, and $CaAlSiN_3:Eu^{2+}$; T is selected from the group consisting of Li, Na, K, and Rb, and X is selected from the group consisting of Ge, Si, Sn, Zr, and Ti; M is selected from the group consisting of Ca, Sr, and Ba; and the second red fluorescent powder is selected from the group consisting of $CaS:Eu^{2+}$, $SrS:Eu^{2+}$, $Ba_2ZnS_3:Mn^{2+}$, and a red quantum dot. These powders are mixed to form a white light.

In another embodiment, the LED chip comes with a plural quantity, and the LED chips include a chip with a light emission wavelength falling within a range of 400-460 nm and a green chip, and the light excitation structure comprises a second red fluorescent powder containing sulfur; and the second red fluorescent powder is selected from the group consisting of $CaS:Eu^{2+}$, $SrS:Eu^{2+}$, $Ba_2ZnS_3:Mn^{2+}$, and a red quantum dot. These are mixed to form a white light.

In another embodiment, the LED chip comes with a plural quantity, and the LED chips include a chip with a light emission wavelength falling within a range of 400-460 nm and a green chip, and the light excitation structure comprises a first red fluorescent powder and a second red fluorescent powder, and the first red fluorescent powder does not contain sulfur, and the second red fluorescent powder contains sulfur; and the first red fluorescent powder is selected from the group consisting of $T_2XF_6:Mn^{4+}$, $M_2Si_5N_8:Eu^{2+}$, and $CaAlSiN_3:Eu^{2+}$; T is an element selected from the group consisting of Li, Na, K, and Rb; X is an element selected from the group consisting of Ge, Si, Sn, Zr and Ti; M is an element selected from the group consisting of Ca, Sr, and Ba; and the second red fluorescent powder is selected from the group consisting of $CaS:Eu^{2+}$, $SrS:Eu^{2+}$, $Ba_2ZnS_3:Mn^{2+}$, and a red quantum dot. These are mixed to form a white light.

In summation of the description above, the LED light source, LED light source manufacturing method and direct display device in accordance with this disclosure effectively overcome the difficult packaging problem caused by the catalyst poisoning while improving the efficiency of light emission and the stability of light color. With the protection structure, the light excitation structure and the LED chip can be packaged by the encapsulation structure in a lower hardness status without worrying about a drop of moisture and oxygen resisting performance due to a low hardness. In subsequent applications, the light output performance of the direct display device can be improved effectively, and the direct display device has a higher contrast and better optical effect, so as to reduce the quantity of direct display devices used in an application significantly.

DESCRIPTION OF THE PREFERRED EMBODIMENTS

Figure 1:
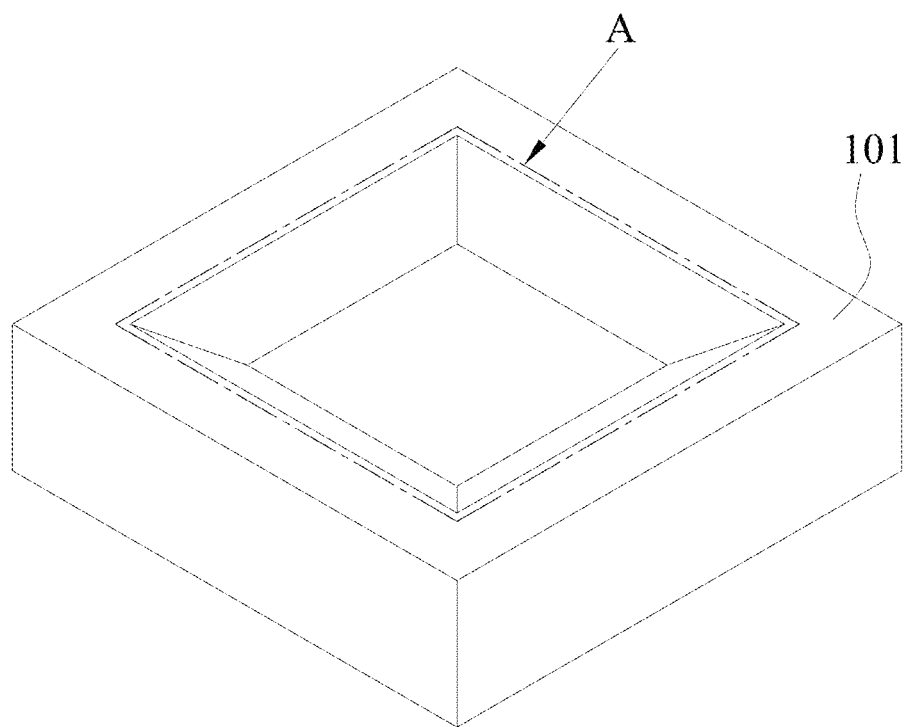
FIG. 1 is a schematic view of a base of this disclosure.

The above and other objects, features and advantages of this disclosure will become apparent from the following detailed description taken with the accompanying drawings. Only some embodiments of the present disclosure have been illustrated in the drawings, but it should be pointed out that many other modifications are conceivable within the scope of the following claims.

From the advancement and practice of LED packaging process, we know that an LED packaging material and a light-emitting material with a catalyst poison particularly a sulfur-containing light-emitting material will have a catalyst poisoning phenomenon when they are packaged in a sealed high-temperature environment, so that when the packaging material is baked and cured, the catalyst poison substance and the packaging material will be volatilized at the same time, and the packaging material will be catalyst poisoned, hardened and incomplete. As a result, the packaging material cannot be solidified successfully to gain the hardness required for protecting the LED chip and the light-emitting material. Particularly, when silicone is used as the packaging material, the catalyst poisoning phenomenon is more serious. However, the conventional light-emitting material containing the catalyst poison has a spectral half-wave width much lower than those of other light-emitting materials and provides a better color rendering, and silicone with the features of heat and moisture resistance is favorable for the packaging performance of the LED, so as to extend the service life of the LED effectively. However, it falls into an embarrassing situation of unable to package the LED effectively. On the other hand, the LED chip is disposed on a metal reflective layer in the base and very vulnerable to the sulphur composition coming from the LED component itself or the external environment. After the light-emitting material containing the sulfur (S) composition is packaged to the LED through the plastic packaging material, the sulfur will corrode the metal reflective layer in the base carrying the LED chip. For example, the metal reflective layer may be reacted with electroplating silver, silver, or sulfur to produce silver sulfide, and there are three typical chemical reactions as described below: $4Ag+2H_2S+O_2 \rightarrow 2Ag_2S+2H_2O$; $2Ag+S \rightarrow Ag_2S$; and $Ag_2S+2O_2 \rightarrow Ag_2SO_4/Ag_2O$. Since silver sulfide is not electrically conductive, therefore the resistance of LED will increase gradually with the vulcanization and affect the electrical properties of the LED, or the LED may even be unable to light up. Silver sulfide is a black crystal, and thus the metal reflective layer of the LED may lose the effect of the reflection light and cause a decreased brightness of the LED light source. In the packaging process, sulfur existing in the environment may penetrate into the LED and cause the aforementioned vulcanization. In general, the conventional LED products have serious vulcanization and catalyst poisoning phenomenon, and these problems are still insolvable effectively. Therefore, related manufacturers stop using the material containing sulfur and any material causing the catalyst poisoning phenomenon, and switch using other materials for the packaging and production of the LED light source. If one has to use the aforementioned light-emitting material, then a plastic material such as UV plastic or acrylic plastic which does not have the catalyst poisoning phenomenon easily is used for the packaging and production instead. Although the materials can be cured, the characteristic of unable to resist high temperature may change the color of the plastic due to the light/heat produced by the LED, or the material may be even cracked or decomposed. The light emission efficiency of the LED will be attenuated with time quickly. As a result, the product yield and reliability fail to comply with requirements.

Figure 3:
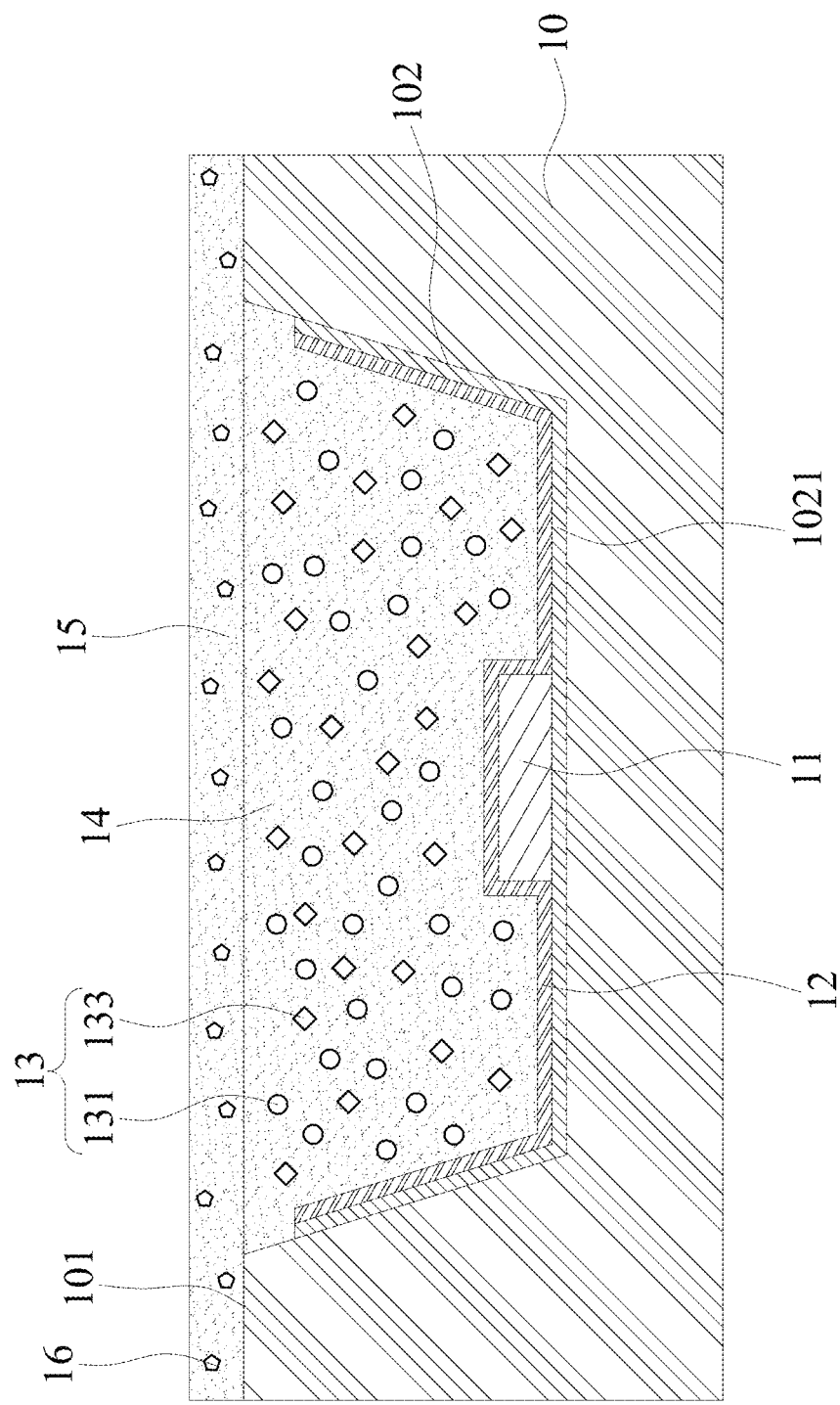
FIG. 3 is a second cross-sectional view of an LED light source in accordance with the first embodiment of this disclosure.

To overcome the aforementioned problem of the LED light source using the aforementioned materials and the drawbacks of the manufacturing process and subsequent applications, the disclosurer of this disclosure conducted research and development extensively and provided the following LED light source. With reference to FIGS. 1 and 3 for the schematic view of a base this disclosure, the first cross-sectional view of an LED light source, and the second cross-sectional view of the LED light source in accordance with the first embodiment of this disclosure respectively, the LED light source 1 comprises a base 10, at least an LED chip 11, an anti-vulcanization structure 12, a light excitation structure 13, an encapsulation structure 14 and a protection structure 15. The base 10 has an upper edge 101, a light emitting region A formed and enclosed by the upper edge 101, an inner mounting surface 102 concavely formed on the base 10 and along the upper edge 101, and a reflective layer 1021 disposed on the inner mounting surface 102. Wherein, the light emitting region A refers to the region enclosed by the upper edge 101 of the base 10, and the reflective layer 1021 is disposed within a range covering the whole inner mounting surface 102, or may be disposed on a partial region of the inner mounting surface 102. Preferably the reflective layer 1021 is made of silver, gold, or any metal material with good reflection performance. The LED chip 11 is installed at the bottom positon of the inner mounting surface 102 by a flip chip method, and the reflective layer 1021 is installed before or after the LED chip 11 is mounted. The anti-vulcanization structure 12 is continuously and uninterruptible formed on the reflective layer 1021 and a surface of the LED chip 11, wherein the anti-vulcanization structure 12 with its continuous and uninterruptible structure achieves the effect of not producing any gap that may cause vulcanization. Therefore, the anti-vulcanization structure 13 of this disclosure with the continuous and uninterruptible structure is necessary and has the corresponding effect. The light excitation structure 13 comprises at least a fluorescent powder containing sulfur, lead, or phosphorus, and the light excitation structure 13 is installed in the base 10. The encapsulation structure 14 is installed in the base 10 for packaging the light excitation structure 13 and the LED chip 11 into the base 10, and the anti-vulcanization structure 12 isolates the reflective layer 1021 and the LED chip 11 from directly contacting with the encapsulation structure 14, and the encapsulation structure 14 is made of organic silicone and contains a platinum catalyst. The protection structure 15 is installed to the base 10 and covers the encapsulation structure 14 by a dispensing method; wherein the hardness of the encapsulation structure 14 is lower than the hardness of the protection structure 15.

In the LED light source 1 of this disclosure, the metal material in the base 10 can be protected effectively by the anti-vulcanization structure 12 to prevent the blackening phenomenon caused by sulfur. In the LED packaging process and its storage environment, air may contain Sulphur. Now, the anti-vulcanization structure 12 can effectively block and prevent any sulfur from entering into the LED light source 1 to protect the reflective layer 1021. Particularly, if the fluorescent powder 13 of the light excitation structure contains sulfur, the anti-vulcanization structure 12 will provide an excellent protection performance. During the packaging and baking processes of the encapsulation structure 14, the platinum catalyst is reacted with sulfur, lead, or phosphorus to cause a decreased hardness, and the protection structure 15 can prevent incomplete solidification of the encapsulation structure 14 or failure to package and protect the LED chip 11 and the light excitation structure 13 effectively, and further achieve the effect of preventing moisture and oxygen from entering into the LED chip 11. This disclosure also prevents moisture in the air from affecting or oxidizing the LED light source 1 to improve the product yield and reliability of the LED light source 1.

To provide a multi-directional light output of the LED light source 1, the base 10 is made of a transparent material. The encapsulation structure 14 is cured by a low-temperature baking for an hour, so that the encapsulation structure 14 slightly has the viscosity and is capable of combining with the protection structure 15 successfully within a specified range of hardness. The use of a lower baking temperature can reduce the reaction of the platinum catalyst with sulfur, lead, or phosphorus. The protection structure 15 is preferably made of organic silicone to facilitate the combination with the encapsulation structure 23 and prevent affecting the light output of the LED light source 1 by heterostructures. Preferably, the light output angle of the LED light source 1 falls within a range of 130-140 degrees.

Compared with the prior art, the protection structure 15 of the LED light source 1 has a different structural design with respect to the traditional mask, wherein the protection structure 15 is formed by a dispensing method, so that the protection structure 15 and the encapsulation structure 14 are plastics to improve the tight combination between the two and achieve good light output performance and protection. In other words, the protection structure 15 is made of a plastic material, but not formed first and then attached onto the encapsulation structure 14. The protection structure 15 is coated or dispensed at the encapsulation structure 14 and then cured and combined tightly with the encapsulation structure 14. The procedure of manufacturing the LED light source 1 will be described in details below.

Since the LED chip 11 is installed at a bottom position of the inner mounting surface 102 by a flip chip method, so that the LED chip 11 requires no wire bonding process. Preferably, the encapsulation structure 14 has a hardness falling within a range of D40-D60 to prevent the encapsulation structure 14 from becoming a liquid due to a too-low hardness, so that the light excitation structure 13 cannot react, or the encapsulation structure 14 is too soft and not suitable for packaging the light excitation structure 13 and the LED chip 11. In addition, if the plastic material has a higher density, its corresponding hardness and oxygen and moisture resistance will be higher. The protection structure 15 of the LED light source 1 is disposed at the outermost layer of the whole structure and used as a first wire device for blocking oxygen and moisture, and its hardness preferably falls within a range of D60-D80, and a high density to block the moisture and oxygen and maintain a good protection strength.

As described above, the LED light source 1 of this disclosure has an excellent protection function by packaging the sulfur-containing light excitation structure 13 effectively, or provides an excellent light emission performance. After the LED is soldered to the circuit board for application, the LED has to go through a Surface Mount Technology Reflow Soldering Test (SMTRST). If the test is passed, a serious attenuation will occur, and the LED will become usable. For the LED light source 1 of this disclosure, the disclosurer conducted a Surface Mount Technology Reflow Soldering Test (SMTRST) of the conventional LED at 260 degrees, and the test results show that the LED light source 1 of this disclosure provides more uniformly light color, better brightness and better product reliability. The test results and detailed contents will be described in details below.

In the field of manufacturing LEDs, the light output of the LED is limited within a target color frame in a CIE chromaticity map according to the requirement of the output light color. Therefore, it is an important subject for LED manufacturers to minimize the alternation amplitude of the LED in the target color frame, so that the output light of the LED at different angles has the same color. In other words, the LED needs a better uniformity of the light color distribution. It is noteworthy that the range of the CIE-x axis of the target color frame of the conventional LED is limited, and the portion with a deviated light color is situated within the range of the CIE-y axis, so that if the light color difference of the CIE-y axis can be decreased effectively, the uniformity of the output light color of the LED can be improved significantly. To provide a consistent output light color and reduce the color deviation, this disclosure provides an LED light source 1 further comprising a plurality of uniform light particles 16 scattered in the protection structure 15 and uniformly distributed, wherein the uniform light particle 16 is selected from the group consisting of $SiO_2$, BN, $Al_2O_3$, and $TiO_2$ or a combination thereof. The uniform light particles 16 can produce refraction or reflection of the light passing through the protection structure 15, so that the protection structure 15 can improve the mixed light effect and maintain the output light color of the LED light source 1 at different angles to be consistent, and achieve a more uniform light output. Preferably, the uniform light particles 16 relative to the protection structure 15 has a weight percentage concentration falling within a range of 5%-15% to prevent a large change of light color due to the low weight percentage concentration of the uniform light particles 16, or an excessive attenuation of the brightness (which fails to comply with the requirement of use) due to a high weight percentage concentration. For the LED light source 1 added with the uniform light particles 16 of different weight percentage concentrations, the disclosurer of this disclosure measures the light color and brightness, and then adds the uniform light particles 16 according to the measurement results to further improve the uniformity of the output light color of the LED light source 1 at different angles. The measurement results will be described in details below.

Figure 2:
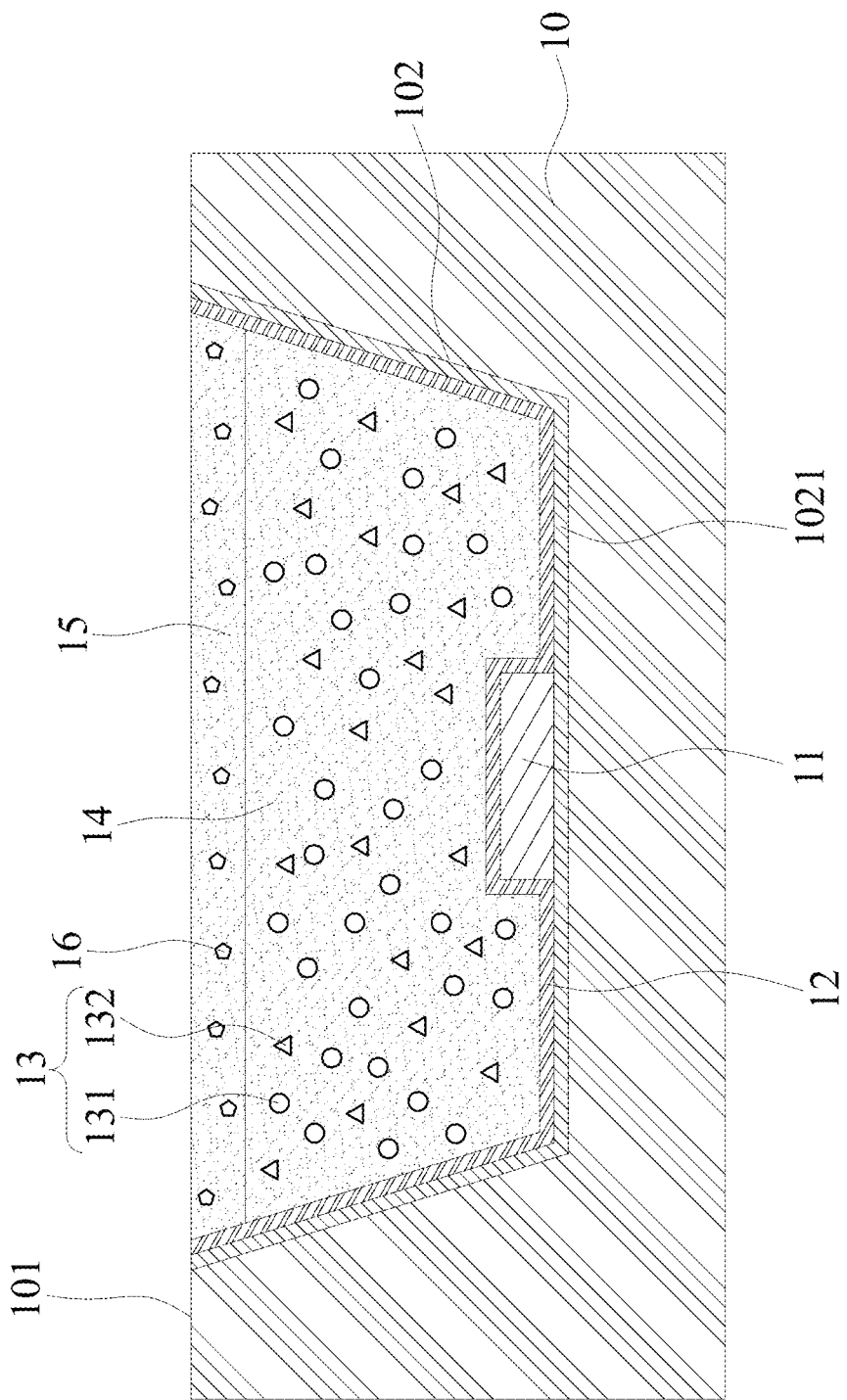
FIG. 2 is a first cross-sectional view of an LED light source in accordance with a first embodiment of this disclosure.

With reference to FIG. 2 for a specific structure of the LED light source 1 in accordance with this embodiment, the LED chip 11 has a light emission wavelength falling within a range of 400-460 nm, and the light excitation structure 13 comprises a green fluorescent powder 131 and a first red fluorescent powder 132, and the green fluorescent powder 131 contains sulfur, and the first red fluorescent powder 132 does not contain sulfur; and the first red fluorescent powder 132 is selected from the group consisting of $T_2XF_6:Mn^{4+}$, $M_2Si_5N_8:Eu^{2+}$, and $CaAlSiN_3:Eu^{2+}$; T is an element selected from the group consisting of Li, Na, K, and Rb, and X is an element selected from the group consisting of Ge, Si, Sn, Zr, and Ti; and M is an element selected from the group consisting of Ca, Sr, and Ba. After the LED light source 1 is driven, the light emitted from the LED chip 11, the green light excited and emitted by the green fluorescent powder 131, and the red light excited and emitted by the first red fluorescent powder 132 are mixed to emit a white light. Preferably, the green fluorescent powder 131 is a material selected from the group consisting of CdS and ZnS quantum dot light-emitting materials and $SrGa_2S_4:En^{2+}$, and the green fluorescent powder 131 has a spectral half-wave width falling within a range of 20-40 nm or 40-60 nm, and the first red fluorescent powder 132 has a spectral half-wave width falling within a range of 2-7 nm or 75-95 nm. Wherein, the green fluorescent powder 131 may be the aforementioned materials. In other implementation modes, the green fluorescent powder 131 may also be a quantum dot light-emitting material containing lead or lead selected from the group consisting of $CsPbBr_3$ and InP. Wherein, the light emission wavelength of 400-460 nm is mostly suitable for absorption by the light excitation structure 13 and complies with the light color specification for applications in the field of display, so that the LED chip 11 with the light emission wavelength of 400-460 nm may be used to obtain the best light output performance and light emission efficiency.

With reference to FIGS. 1 and 3, FIG. 3 shows a second cross-sectional view of an LED light source in accordance with the first embodiment of this disclosure. In addition to the configuration as described above, the LED chip 11 with a light emission wavelength falling within a range of 400-460 nm is used, and the light excitation structure 13 comprises a green fluorescent powder 131 and a second red fluorescent powder 133, and the green fluorescent powder 131 contains sulfur, and the second red fluorescent powder 133 also contains sulfur. Wherein, the second red fluorescent powder 133 is selected from the group consisting of $CaS:Eu^{2+}$, $SrS:Eu^{2+}$, $Ba_2ZnS_3:Mn^{2+}$, and a red quantum dot. Preferably, the green fluorescent powder 131 has a spectral half-wave width falling within a range of 20-40 nm or 40-60 nm, and the second red fluorescent powder 133 has a half-wave width falling within a range of 20-40 nm or 55-75 nm. Wherein, when the second red fluorescent powder 133 is a red quantum dot material, the second red fluorescent powder 133 may be ZnS, CdS, etc. Both of the green fluorescent powder 131 and the second red fluorescent powder 133 containing the sulfur fluorescent powder provide a better color mixing effect of the LED light source 1. In such structure, the reflective layer 1021 not completely covering the inner mounting surface 102 is used as an example, and the anti-vulcanization structure 12 as shown in FIG. 3 is continuously and uninterruptible formed at the reflective layer 1021 and a surface of the LED chip 11 to block and prevent the vulcanization of the metal material in the base 10. Besides the aforementioned material used as the green fluorescent powder 131 and second red fluorescent powder 133, the second red fluorescent powder 133 of another embodiment may be one selected from the group consisting of $CsPbBr_3$, InP, or any other quantum dot light-emitting material containing lead or phosphorus, and the green fluorescent powder 131 may be one selected from the group consisting of $CsPbBr_3$, InP, or any other quantum dot light-emitting material containing lead or phosphorus, which is also applicable for the LED light source 1.

To prevent the encapsulation structure 14 from being crushed after the protection structure 15 with a greater hardness is formed and dispensed, the protection structure 15 is dispensed at the upper edge 101 of the base 10, and the protection structure 15 has an area greater than the area of the light emitting region A in order to provide a sufficient supporting force to the protection structure 15.

Figure 4:
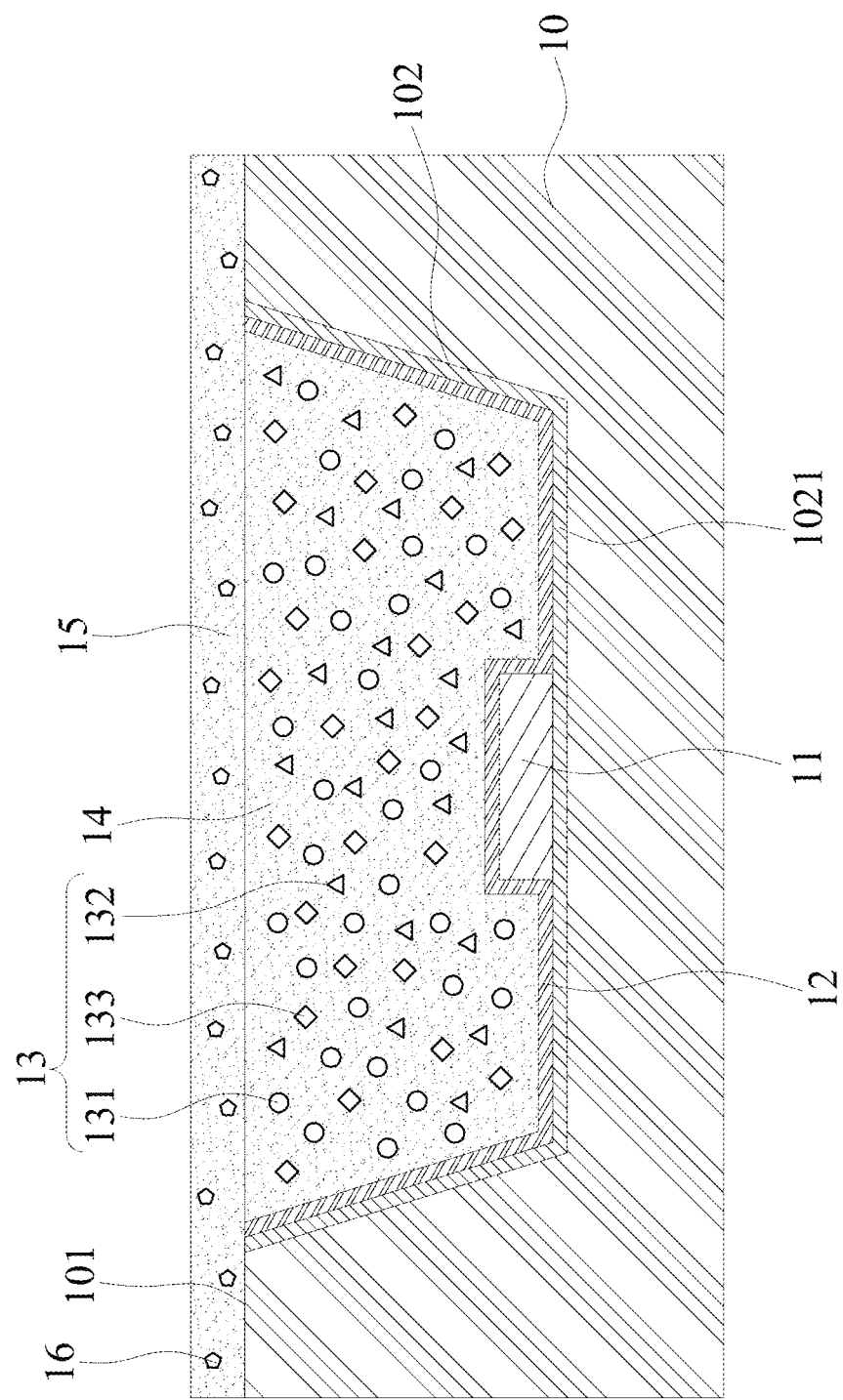
FIG. 4 is a third cross-sectional view of an LED light source in accordance with the first embodiment of this disclosure.

With reference to FIGS. 1 and 4, FIG. 4 shows a third cross-sectional view of an LED light source in accordance with the first embodiment of this disclosure. In addition to the configuration as described above, the LED chip 11 of the LED light source 1 has a light emission wavelength falling within a range of 400-460 nm, and the light excitation structure 13 comprises the green fluorescent powder 131, the first red fluorescent powder 132 and the second red fluorescent powder 133, and the green fluorescent powder 131 contains sulfur, and the first red fluorescent powder 132 does not contain sulfur, and the second red fluorescent powder 133 contains sulfur. Wherein, the first red fluorescent powder 132 is selected from the group consisting of $T_2XF_6:Mn^{4+}$, $M_2Si_5N_8:Eu^{2+}$, and $CaAlSiN_3:Eu^{2+}$; T is an element selected from the group consisting of Li, Na, K, and Rb, and X is an element selected from the group consisting of Ge, Si, Sn, Zr, and Ti; M is an element selected from the group consisting of Ca, Sr, and Ba, the second red fluorescent powder 133 is selected from the group consisting of $CaS:Eu^{2+}$, $SrS:Eu^{2+}$, $Ba_2ZnS_3:Mn^{2+}$, and a red quantum dot. Preferably, the green fluorescent powder 131 has a spectral half-wave width with a range of 20-40 nm or 40-60 nm, and the first red fluorescent powder 132 has a spectral half-wave width falling within a range of 2-7 nm or 75-95 nm, and the second red fluorescent powder 133 has a spectral half-wave width falling within a range of 20-40 nm or 55-75 nm. The mixture of the first red fluorescent powder 132 and the second red fluorescent powder 133, one containing sulfur and the other one not containing sulfur overcomes the light color issue of the LED light source 1 and even reduces the afterimage of red light in some applications, so as to improve the light output performance of the LED light source 1 effectively. In addition to the aforementioned materials used as the second red fluorescent powder 133 and the green fluorescent powder 131, the second red fluorescent powder 133 may also be one selected from the group consisting of CsPbBr3, InP, or any quantum dot light-emitting material containing lead or phosphorus, and the green fluorescent powder 131 may also be one selected from the group consisting of CsPbBr3, InP, or any quantum dot light-emitting material containing lead or phosphorus, which are also applicable to the LED light source 1.

Figure 5:
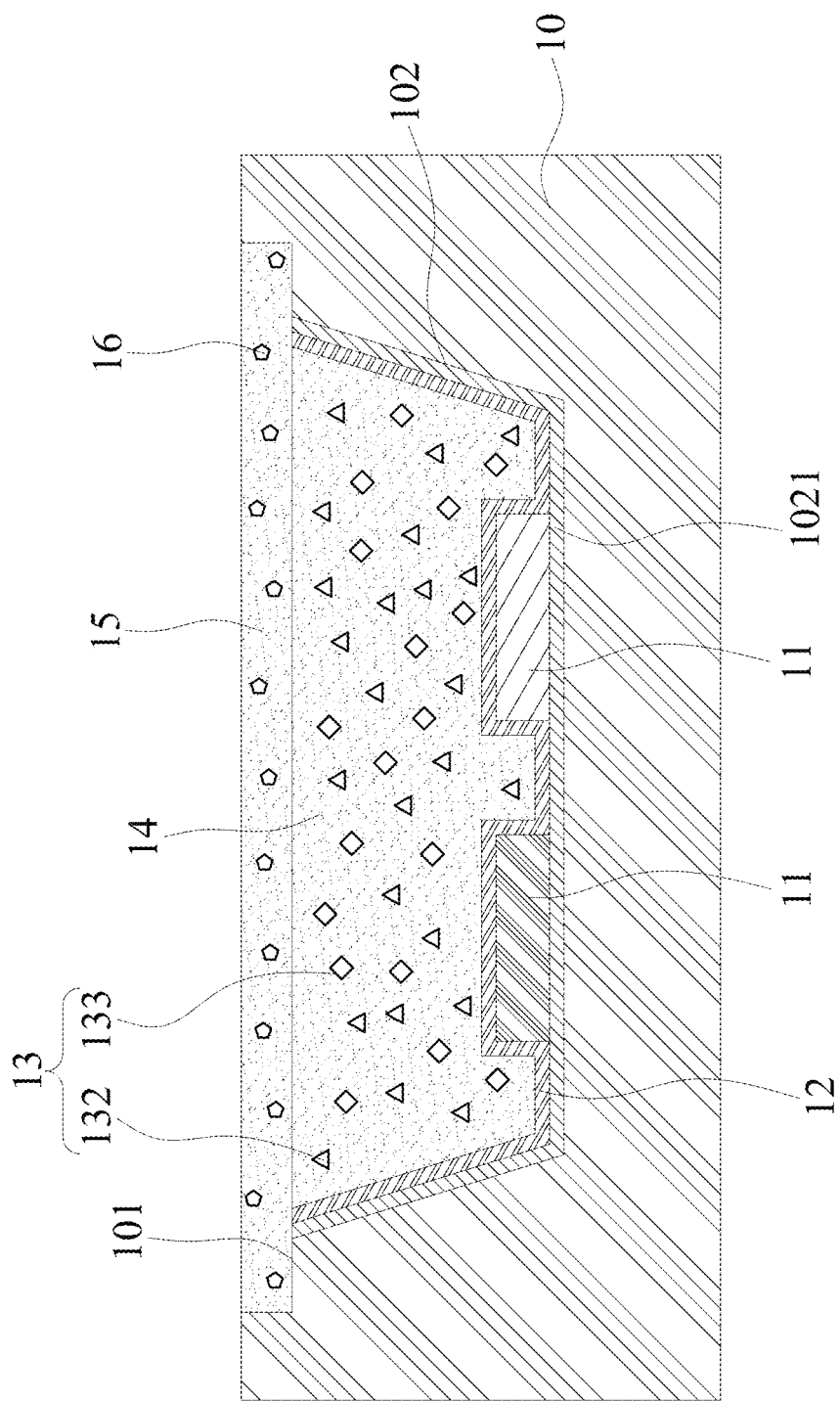
FIG. 5 is a fourth cross-sectional view of an LED light source in accordance with the first embodiment of this disclosure.

With reference to FIGS. 1 and 5, FIG. 5 shows a fourth cross-sectional view of an LED light source in accordance with the first embodiment of this disclosure. In addition to the description of the protection structure 15 having an area greater than the area of the light emitting region A, the upper edge 101 of the base 10 may be formed into a stepped shape to achieve the effects of accommodating and fixing the protection structure 15, enhancing the fixing and supporting performance, blocking and preventing the protection structure 15 from pressing and damaging the encapsulation structure 14, and providing a good efficiency to the dispensing process. Wherein, the LED chip 11 of the LED light source 1 comes with a plural quantity and the LED chips 11 include a chip with a light emission wavelength falling within a range of 400-460 nm and a green chip, and the light excitation structure 13 comprises a second red fluorescent powder 133, and the second red fluorescent powder 133 contains sulfur. Wherein, the second red fluorescent powder 133 is selected from the group consisting of $CaS:Eu^{2+}$, $SrS:Eu^{2+}$, $Ba_2ZnS_3:Mn^{2+}$, and a red quantum dot. Preferably, the second red fluorescent powder 133 has a spectral half-wave width of approximately 20-40 nm or 55-75 nm. In the LED light source 1, the lights emitted from the LED chips 11 are combined with the sulfur-containing second red fluorescent powder 133 and mixed to form a white light. Alternatively, or the LED chip 11 as shown in FIG. 5 comes with a plural quantity, and the LED chips 11 comprises a chip with a light emission wavelength falling within a range of 400-460 nm and a green chip, and the light excitation structure 13 comprises a first red fluorescent powder 132 and a second red fluorescent powder 133, and the first red fluorescent powder 132 does not contain sulfur, and the second red fluorescent powder 133 contains sulfur. Wherein, the first red fluorescent powder 132 is selected from the group consisting of $T_2XF_6:Mn^{4+}$, $M_2Si_5N_8:Eu^{2+}$, and $CaAlSiN_3:Eu^{2+}$; T is an element selected from the group consisting of Li, Na, K, and Rb, and X is an element selected from the group consisting of Ge, Si, Sn, Zr, and Ti; M is an element selected from the group consisting of Ca, Sr, and Ba, the second red fluorescent powder 133 is selected from the group consisting of $CaS:Eu^{2+}$, $SrS:Eu^{2+}$, $Ba_2ZnS_3:Mn^{2+}$, and a red quantum dot. Preferably, the first red fluorescent powder 132 has a spectral half-wave width falling within a range of 2-7 nm or 75-95 nm, and the second red fluorescent powder 133 has a spectral half-wave width of 20-40 nm or 55-75 nm. In this embodiment, the sulfur-containing and non-sulfur-containing first red fluorescent powder 132 and second red fluorescent powder 133 has a high light color expression and also reduces the after image caused by the red light. Of course, when the upper edge 101 of the base 10 is formed into a stepped shape, the LED chip with a light emission wavelength falling within a range of 400-460 nm is used, and the light excitation structure 13 is a structure comprising the green fluorescent powder 131 and the first red fluorescent powder 132 and/or the second red fluorescent powder 133. Wherein, the aforementioned materials are used as the second red fluorescent powder 133, and when the second red fluorescent powder 133 is a red quantum dot, a material selected from the group consisting of $CsPbBr_3$, InP, and any other quantum dot light-emitting material containing lead or phosphorus is also applicable for the LED light source and provide a good color mixing performance.

Figure 6:
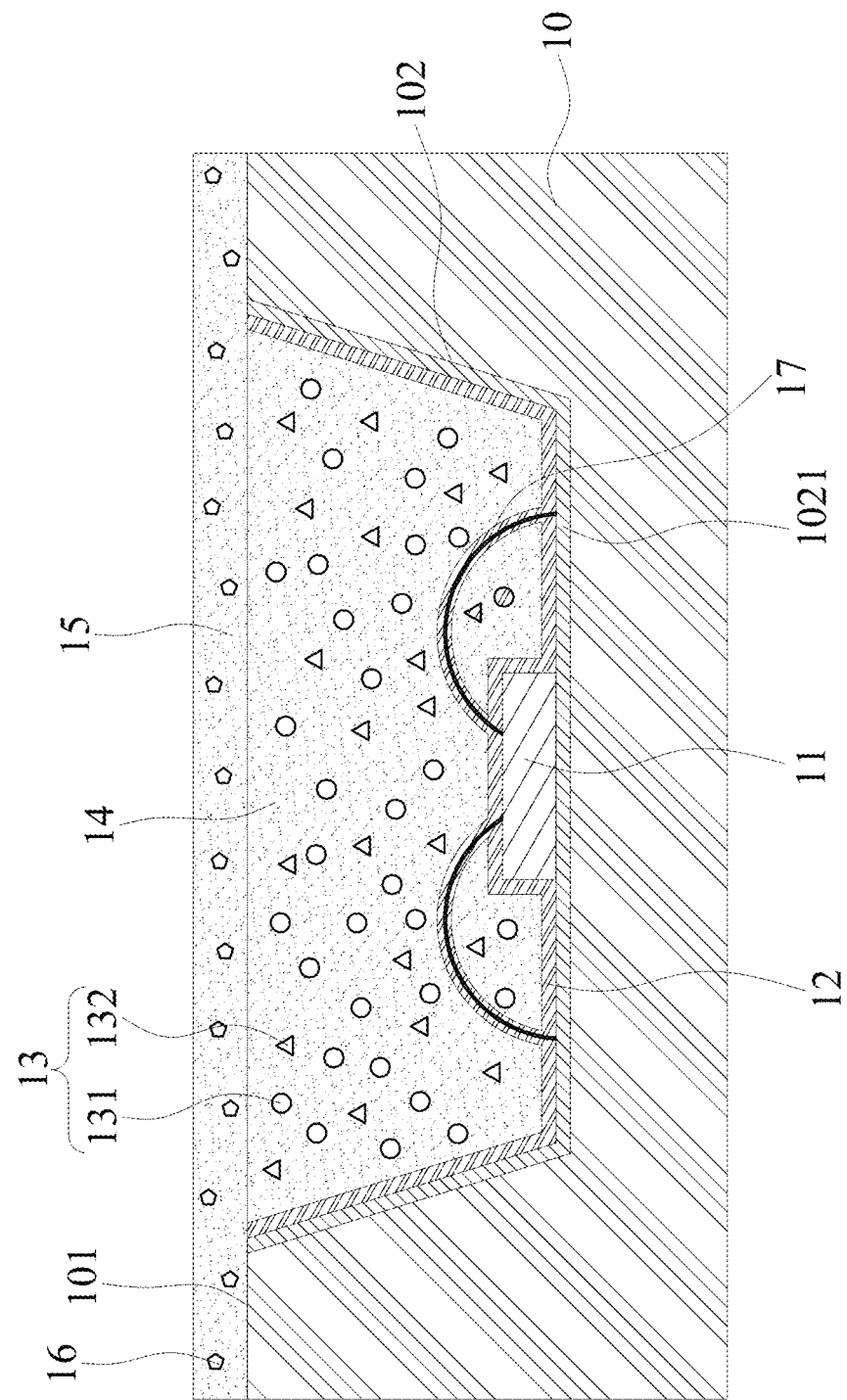
FIG. 6 is a first cross-sectional view of an LED light source in accordance with a second embodiment of this disclosure.

With reference to FIGS. 1 and 6, FIG. 6 shows a first cross-sectional view of an LED light source in accordance with the second embodiment of this disclosure. In addition to the flip chip method used for the LED chip 11 of the LED light source 1, the LED chip 11 may also be configured by the wire bonding method. In this embodiment, the LED light source 1 also comprises the base 10, the LED chip 11, the anti-vulcanization structure 12, the light excitation structure 13, the encapsulation structure 14 and the protection structure 15. The base 10 has an upper edge 101 and a light emitting region A formed and enclosed by the upper edge 101, and the base 10 has an inner mounting surface 102 concavely formed on the base 10 and along the upper edge 101, and a reflective layer 1021 disposed on the inner mounting surface 102. Wherein, the light emitting region A refers to the region formed and enclosed by the upper edge 101 of the base 10 as shown in FIG. 1. The region of the reflective layer 1021 covers the inner mounting surface 102, or a part of the area of the inner mounting surface 102 as required. The LED chip 11 is combined with two metal wire bonds 17 and installed at a bottom position of the inner mounting surface 102 by solid crystallization, and the anti-vulcanization structure 12 is continuously and uninterruptible formed at the reflective layer 1021, the metal wire bonds 17, and a surface of the LED chip 11, wherein the anti-vulcanization structure 12 with the continuous and uninterruptible structural characteristic can prevent any gap produced or caused by the vulcanization, so that the anti-vulcanization structure 13 of this disclosure with the continuous and uninterruptible structural characteristic is necessary to achieve the corresponding effects. The light excitation structure 13 comprises at least a fluorescent powder containing sulfur, lead, or phosphorus, and the light excitation structure 13 is installed in the base 10, and the encapsulation structure 14 is installed in the base 10 and provided for packaging the light excitation structure 13 and the LED chip 11 into the base 10, and the anti-vulcanization structure 12 isolates the reflective layer 1021 and the LED chip 11 from directly contacting with the encapsulation structure 14, and the encapsulation structure 14 is made of organic silicone and contains a platinum catalyst. The protection structure 15 is installed at the base 10 and covered onto the encapsulation structure 14 by a dispensing method.

Similarly, the anti-vulcanization structure 12 is provided for effectively protecting the structure of the metal material in the base 10 to prevent any vulcanization caused by the environment, the light excitation structure, or other components. The protection structure 15 is provided for preventing the encapsulation structure 14 from being cured incompletely or failing to effectively package and protect the LED chip 11 and the light excitation structure 13, and further achieves the effect of preventing moisture and oxygen from entering into the encapsulation structure 14 to improve the product yield and reliability of the LED light source 1. With the installation of the LED source 1 by wire bonding or solid crystallization, the base 10 is made of a transparent material, and the protection structure 15 is preferably one selected from the group consisting of organic silicone to facilitate the combination with the encapsulation structure 23 and prevent the heterostructure from affecting the light output of the LED light source 1. Wherein, the encapsulation structure 14 is preferably cured at a low-temperature baking environment for an hour in order to combine with the protection structure 15 within a range of curing hardness. The remaining details and technical characteristics are the same as those described in the aforementioned embodiments and will not be repeated.

Unlike the prior art, the protection structure 15 of the LED light source 1 is different from the structural design of the traditional mask, and the protection structure 15 is formed by a dispensing method, so that the protection structure 15 and the encapsulation structure 14 made of a plastic material can improve the connection between the protection structure 15 and the encapsulation structure 14 to achieve good light output performance and protection performance. In other words, the protection structure 15 is not installed on the encapsulation structure 14 by an attaching method after the protection structure 15 in the manufacturing process, but it is installed at the encapsulation structure 14 by a dispensing method, and then cured to combine with the encapsulation structure 14 tightly.

Since the LED chip 11 combined with the metal wire bonds 17 is installed at the bottom position of the inner mounting surface 102, the metal wire bonds 17 may be broken or cracked easily if the hardness of the encapsulation structure 14 is too high. Therefore, the hardness of the encapsulation structure 23 preferably falls within a range of D20-D40 to prevent the metal wire bonds 17 from being broken or cracked by a high hardness. In addition, when the plastic material has an increasingly higher density, the corresponding hardness and strength of blocking oxygen and moisture become increasingly greater. The protection structure 15 of the LED light source 1 is a first wire device disposed on the outermost layer of the whole structure and provided for blocking and oxygen and moisture, and whose hardness preferably falls within a range of D60-D80 and the protection structure 15 has a higher density to block moisture and oxygen and provides a good protection strength.

Since the hardness of the anti-vulcanization structure 12 approximately falls within a range of D70-D100, and a solder ball formed by combining the LED chip 11 with the metal wire bonds 17 has a thickness generally falling within a range of 10-20 μm, in order to prevent the anti-vulcanization structure 12 from being too-thick, such that the metal wire bonds 17 is affected or damaged by the stress caused by thermal expansion and contraction, or prevent the anti-vulcanization structure 12 being too-thin or losing the effect of protecting the reflective layer 1021, and maintain the thickness of the anti-vulcanization structure 12 falling within a range of 2-10 μm.

Similarly, the method of installing the LED chip 11 of the LED light source 1 by the metal wire bonds 17 may be effectively packaged by the light excitation structure 13 containing the aforementioned compositions. In addition to the excellent protection function, the LED chip 11 also has an excellent light emission performance. A Surface Mount Technology Reflow Soldering Test (SMTRST) of the LED light source 1 of this disclosure at 260° is conducted to compared with the conventional LED, and the experiment data and results will be described in details below.

To provide a consistent output light color of the LED light source 1 and reduce the color deviation, the LED light source 1 of this embodiment further comprises a plurality of uniform light particles 16 scattered in the protection structure 15, wherein the uniform light particle 16 is selected from the group consisting of $SiO_2$, BN, $Al_2O_3$, and $TiO_2$ or any combination thereof. With the uniform light particles 16, the light passing through the protection structure has a refraction or reflection, and the protection structure 15 can enhance the mixed light effect, so that the output light colors of the LED light source 1 at different angles are consistent, and the overall light output is more uniformly. Preferably, the uniform light particles 16 relative to the weight percentage concentration of the protection structure falls within a range of 5%-15% to prevent a too-low weight percentage concentration of the uniform light particles 16 (resulting in a too-large variation of light color), or to prevent a too-high weight percentage concentration (resulting in a too-large attenuation of brightness), which is incompliance with the using requirements. For the LED light source 1 added with uniform light particles 16 of different weight percentage concentrations, the disclosurer of this disclosure measures the light color and brightness, and the results show the improved uniformity of the output light color of the LED light source 1 at different angles after the uniform light particles 16 are added, and the measurement results are described in details below.

In this embodiment, the structure of the LED light source 1 is shown in FIG. 6, wherein the LED chip 11 has a light emission wavelength falling within a range of 400-460 nm, and the light excitation structure 13 comprises a green fluorescent powder 131 and a first red fluorescent powder 132, and the green fluorescent powder 131 contains sulfur, and the first red fluorescent powder 132 does not contain sulfur. Wherein, the first red fluorescent powder 132 is selected from the group consisting of $T_2XF_6:Mn^{4+}$, $M_2Si_5N_8:Eu^{2+}$, and $CaAlSiN_3:Eu^{2+}$; T is an element selected from the group consisting of Li, Na, K, and Rb, and X is an element selected from the group consisting of Ge, Si, Sn, Zr, and Ti; M is an element selected from the group consisting of Ca, Sr, and Ba. After the LED light source 1 is driven, the light emitted from the LED chip 11, the green light excited and emitted by the green fluorescent powder 131, and the red light excited and emitted by the first red fluorescent powder 132 are mixed to form and emit a white light. Preferably, the green fluorescent powder 131 has a spectral half-wave width with a range of approximately 20-40 nm or 40-60 nm, and the first red fluorescent powder 132 has a spectral half-wave width falling within a range of 2-7 nm or 75-95 nm. Wherein, the protection structure 15 is installed at the upper edge 101 of the base 10 by the dispensing method, and the protection structure 15 has an area greater than the area of the light emitting region A as shown in FIG. 6 in order to protect the encapsulation structure 14, and provides a support by the upper edge 101 of the base 10, so as to prevent the protection structure 15 from being too hard or pressing/damaging the encapsulation structure 14. Of course, when the LED chip 11 is installed by a wire bonding or solid crystallization method, the protection structure 15 may be dispensed directly as shown in FIG. 2. The other technical characteristics have been described above and thus will not be repeated.

Figure 7:
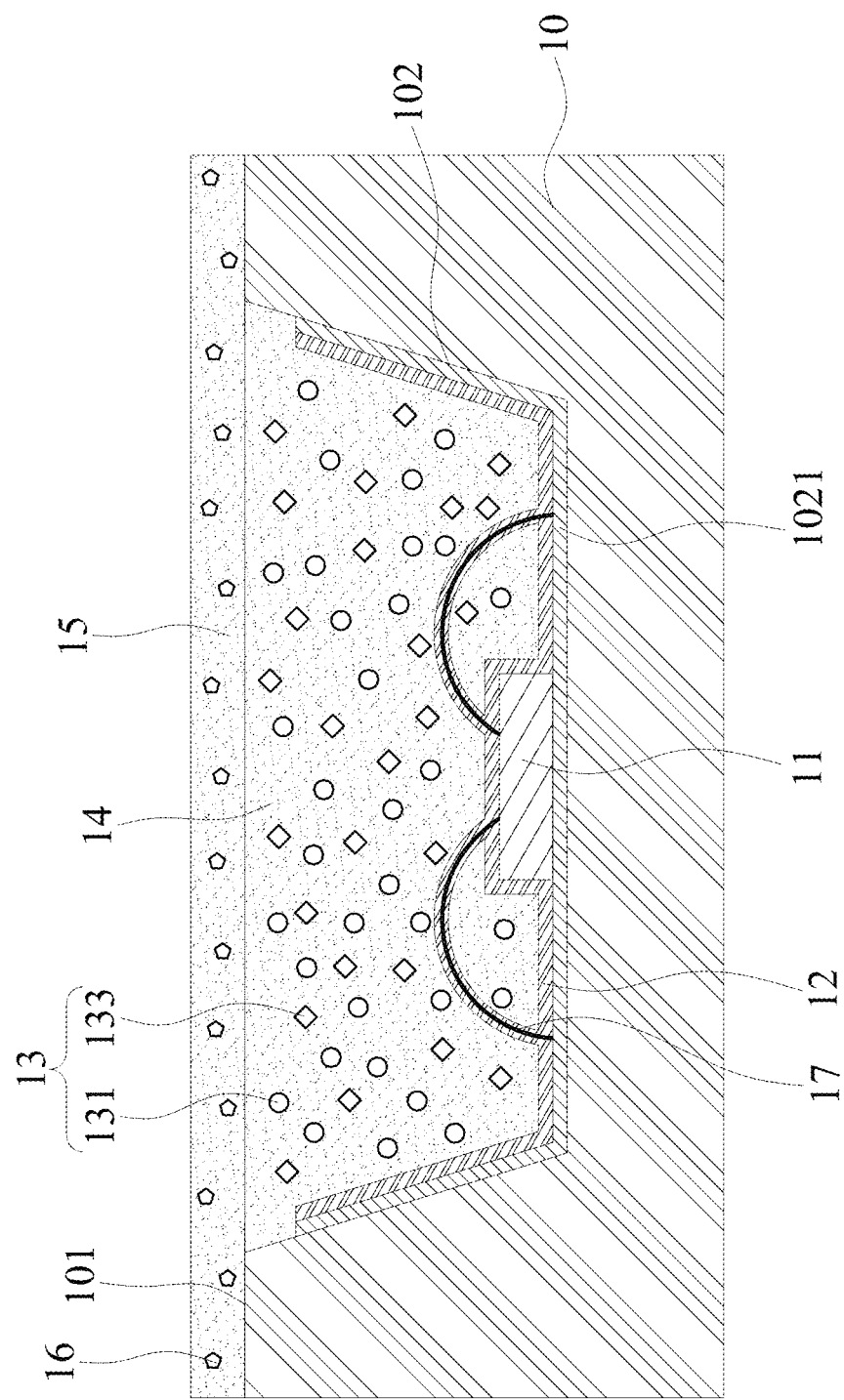
FIG. 7 is a second cross-sectional view of an LED light source in accordance with the second embodiment of this disclosure.

With reference to FIGS. 1 and 7, FIG. 7 shows a second cross-sectional view of an LED light source in accordance with the second embodiment of this disclosure. In addition to the configuration as described above, the LED chip 11 of the LED light source 1 has a light emission wavelength falling within a range of 400-460 nm, and the light excitation structure 13 comprises the green fluorescent powder 131, the first red fluorescent powder 132 and the second red fluorescent powder 133, and the green fluorescent powder 131 contains sulfur, and the second red fluorescent powder 133 also contains sulfur. Wherein, the second red fluorescent powder 133 is selected from the group consisting of $CaS:Eu^{2+}$, $SrS:Eu^{2+}$, $Ba_2ZnS_3:Mn^{2+}$, and a red quantum dot. Preferably, the green fluorescent powder 131 has a spectral half-wave width with a range of 20-40 nm or 40-60 nm, and the second red fluorescent powder 133 has a spectral half-wave width falling within a range of 20-40 nm or 55-75 nm. The mixture of the green fluorescent powder 131 and the second red fluorescent powder 133 containing the sulfur fluorescent powder provides a better color mixing expression of the LED light source 1. In this structure, the reflective layer 1021 has not covered the whole inner mounting surface 102, and the anti-vulcanization structure 12 as shown in FIG. 7 is continuously and uninterruptible formed at the reflective layer 1021, the metal wire bonds 17 and a surface of the LED chip 11 in order to block and prevent the vulcanization of the metal material in the base 10. When the LED chip 11 of the LED light source 1 has a light emission wavelength falling within a range of 400-460 nm, the light excitation structure 13 may also include the green fluorescent powder 131, the first red fluorescent powder 132 and the second red fluorescent powder 133, and the green fluorescent powder 131 contains sulfur, and the first red fluorescent powder 132 does not include sulfur, and the second red fluorescent powder 133 contains sulfur. Wherein, the first red fluorescent powder 132 is selected from the group consisting of $T_2XF_6:Mn^{4+}$, $M_2Si_5N_8:Eu^{2+}$, and $CaAlSiN_3:Eu^{2+}$; T is an element selected from the group consisting of Li, Na, K, and Rb, and X is an element selected from the group consisting of Ge, Si, Sn, Zr, and Ti; M is an element selected from the group consisting of Ca, Sr, and Ba, the second red fluorescent powder 133 is selected from the group consisting of $CaS:Eu^{2+}$, $SrS:Eu^{2+}$, $Ba_2ZnS_3:Mn^{2+}$, and a red quantum dot. Preferably, the green fluorescent powder 131 has a spectral half-wave width falling within a range of 20-40 nm or 40-60 nm, and the first red fluorescent powder 132 has a spectral half-wave width falling within a range of 2-7 nm or 75-95 nm, and the second red fluorescent powder 133 has a spectral half-wave width of 20-40 nm or 55-75 nm. The mixture of the sulfur-containing and non-sulfur-containing first red fluorescent powder 132 and the second red fluorescent powder 133 can improve the light color expression of the LED light source 1 and even can reduce the afterimage of the red light in some applications to effectively improve the light output performance of the LED light source 1.

Figure 8:
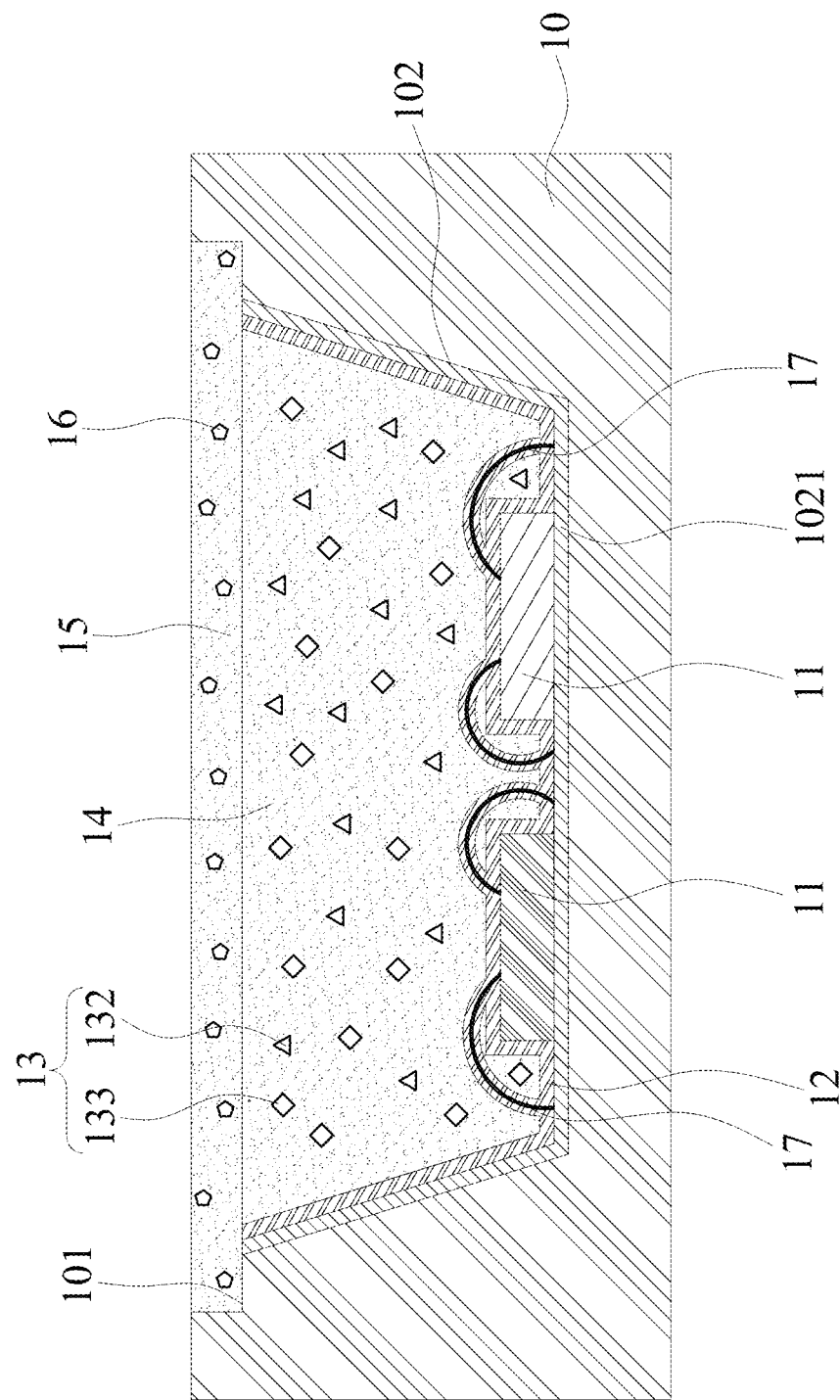
FIG. 8 is a third cross-sectional view of an LED light source in accordance with the second embodiment of this disclosure.

With reference to FIGS. 1 and 8, FIG. 8 shows a third cross-sectional view of an LED light source in accordance with the second embodiment of this disclosure. In addition to the configuration as described above, the upper edge 101 of the base 10 is formed into a stepped shape and capable of accommodating and fixing the protection structure 15, enhancing the fixing and supporting performance, and providing a good efficiency for the dispensing process. In addition, the LED chip 11 comes with a plural quantity, and the LED chips 11 include a chip with a light emission wavelength falling within a range of 400-460 nm and a green chip, and the light excitation structure 13 comprises a second red fluorescent powder 133, and the second red fluorescent powder 133 contains sulfur. Wherein, the second red fluorescent powder 133 is selected from the group consisting of $CaS:Eu^{2+}$, $SrS:Eu^{2+}$, $Ba_2ZnS_3:Mn^{2+}$, and a red quantum dot. Preferably, the second red fluorescent powder 133 has a half-wave width of 20-40 nm or 55-75 nm. In this LED light source 1, the blue and green the LED chip 11 are combined with the non-sulfur-containing first red fluorescent powder 132 and the sulfur-containing the second red fluorescent powder 133 to form a white light. The LED chip 11 as shown in FIG. 8 comes with a plural quantity, and the LED chips 11 includes a chip with a light emission wavelength falling within a range of 400-460 nm and a green chip, and the light excitation structure 13 comprises a first red fluorescent powder 132 and a second red fluorescent powder 133, and the first red fluorescent powder 132 does not contain sulfur, and the second red fluorescent powder 133 contains sulfur. Wherein, the first red fluorescent powder 132 is selected from the group consisting of $T_2XF_6:Mn^{4+}$, $M_2Si_5N_8:Eu^{2+}$, and $CaAlSiN_3:Eu^{2+}$; T is an element selected from the group consisting of Li, Na, K, and Rb, and X is an element selected from the group consisting of Ge, Si, Sn, Zr, and Ti; M is an element selected from the group consisting of Ca, Sr, and Ba, the second red fluorescent powder 133 is selected from the group consisting of $CaS:Eu^{2+}$, $SrS:Eu^{2+}$, $Ba_2ZnS_3:Mn^{2+}$, and a red quantum dot. Preferably, the first red fluorescent powder 132 has a spectral half-wave width falling within a range of 2-7 nm or 75-95 nm, and the second red fluorescent powder 133 has a spectral half-wave width with a range of 20-40 nm or 55-75 nm. In this implementation mode, the sulfur-containing and non-sulfur-containing first red fluorescent powder 132 and second red fluorescent powder 133 has a high light color expression and also reduces the after image produced by the red light. The upper edge 101 of the base 10 is formed into a stepped shape to further prevent the protection structure 15 from pressing and damaging the encapsulation structure 14.

Figure 11:
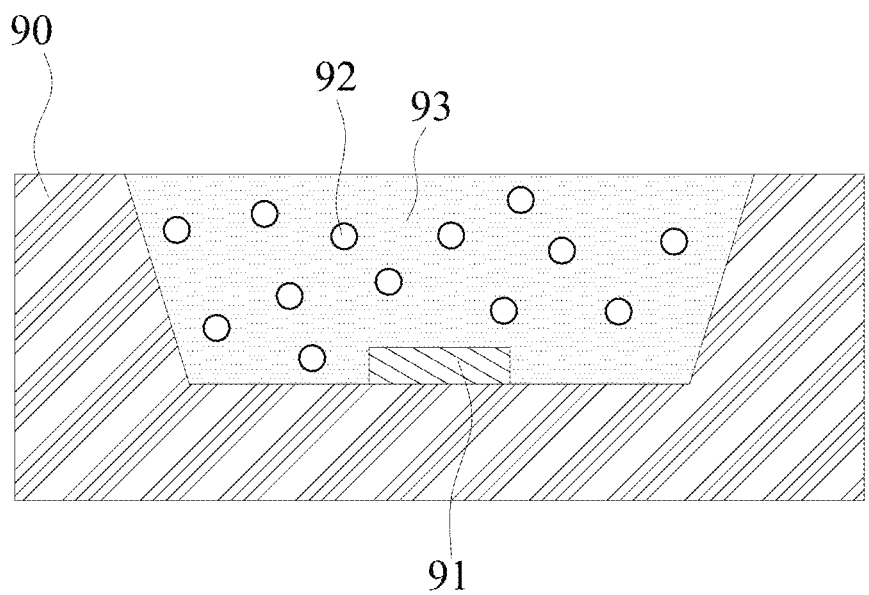
FIG. 11 is a schematic view of a conventional LED.

Experiment data and results of the Surface Mount Technology Reflow Soldering Test (SMTRST) of the LED light source 1 of this disclosure and the conventional LED 9 conduced at 260° are compared and described below. Table 1 lists the experiment results of the SMTRST of the conventional LED including a purple LED chip or a blue LED chip conducted for two times. The structure of the tested conventional LED 9 is shown in FIG. 11, wherein the structure comprises a base 90, and a packaging material 93 for packaging a sulfur-containing light-emitting material 92 and a blue or purple LED chip 91 into the base 90. In Table 1, after the SMTRST of the conventional LED 9 is conducted, the brightness of the conventional LED 9 is attenuated for approximately 20-30%, and the light color is shifted for approximately 5-11BIN (wherein the numerical value of each BIN is 0.005).

TABLE 1

| Type of Chip bundled in the Conventional LED | Brightness Attenuation Value before/after SMTRS for one time | Brightness Attenuation Value before/after SMTRS for two times | Light Color CIE-x Attenuation Value before/after SMTRS for one time | Light Color CIE-x Attenuation Value before/after SMTRS for two times | Light Color CIE-y Attenuation Value before/after SMTRS for one time | Light Color CIE-y Attenuation Value before/after SMTRS for two times |
|---|---|---|---|---|---|---|
| Blue light LED chip | 73.82% | 72.97% | −0.0131 | −0.0138 | −0.0278 | −0.0283 |
| Purple light LED chip | 76.83% | 75.26% | −0.0197 | −0.0211 | −0.0541 | −0.0582 |

Table 2 shows the experiment results of the protection structure 15 of the LED light source 1 of this disclosure made of organic silicone and having a hardness of D80 and bundled with the blue light or purple light LED chip 11. After a SMTRST of the LED light source 1 is conducted, the brightness of the LED light source 1 is attenuated by approximately 6%, and the light color is shifted by approximately 3BIN (wherein the numerical value of one BIN is 0.005).

Please refer to the contents of the following tables for the measurement result of the light color CIE-x color difference, the light color CIE-y color difference and the attenuation of brightness of the LED light source 1 with/without adding the uniform light particles 16 (such as $Al_2O_3$) of different weight percentage concentrations. Since the LED light source 1 has

TABLE 2

| Type of chip bundled with LED light source | Brightness Attenuation Value before/after SMTRS for one time | Brightness Attenuation Value before/after SMTRS for two times | Light Color CIE-x Attenuation Value before/after SMTRS for one time | Light Color CIE-x Attenuation Value before/after SMTRS for two times | Light Color CIE-y Attenuation Value before/after SMTRS for one time | Light Color CIE-y Attenuation Value before/after SMTRS for two times |
|---|---|---|---|---|---|---|
| Blue light LED chip | 99.19% | 97.76% | −0.0006 | −0.0016 | −0.001 | −0.0028 |
| Purple light LED chip | 97.53% | 96.90% | −0.0054 | −0.0063 | −0.0069 | −0.0056 |

Table 3 shows the experiment results of the protection structure 15 of the LED light source 1 of this disclosure made of organic silicone and having a hardness of D65 and bundled with the blue light or purple light LED chip 11. After a SMTRST of the LED light source 1 is conducted, the brightness of the LED light source 1 is attenuated by approximately 10%, and the light color is shifted by approximately 3BIN (wherein the numerical value of one BIN is 0.005).

a light output angle falling within a range of 130-140°, and thus the largest angle of the measurement is up to ±70°.

Table 4 shows the experiment data and results of the light color CIE-x color difference after the protection structure 15 of the LED light source 1 is added with the uniform light particles 16 of different weight percentage concentrations; Table 5 shows the experiment data and results of the light color CIE-y color difference after the protection structure 15 of the LED light source 1 is added with the uniform light particles 16 of different weight percentage concentrations; and Table 6 shows the experiment data and results of the

TABLE 3

| Type of chip bundled with LED light source | Brightness Attenuation Value before/after SMTRS for one time | Brightness Attenuation Value before/after SMTRS for two times | Light Color CIE-x Attenuation Value before/after SMTRS for one time | Light Color CIE-x Attenuation Value before/after SMTRS for two times | Light Color CIE-y Attenuation Value before/after SMTRS for one time | Light Color CIE-y Attenuation Value before/after SMTRS for two times |
|---|---|---|---|---|---|---|
| blue light LED chip | 89.04% | 85.18% | −0.0039 | −0.0047 | −0.0091 | −0.0112 |
| purple light LED chip | 96.00% | 94.72% | −0.0047 | −0.0049 | −0.0096 | −0.0122 |

From the aforementioned experiment results, the LED light source 1 of this disclosure can effectively overcome the attenuation issue of the conventional LED 9, so that the attenuation of brightness is decreased from 20-30% to 15%, or even down to 6%, and the attenuation of light color is controlled and decreased from 5-15BIN, to 3BIN or even down to 2BIN.

attenuation of brightness after the protection structure 15 of the LED light source 1 is added with the uniform light particles 16 of different weight percentage concentrations; wherein the light color CIE-x color difference, the light color CIE-y color difference and the attenuation of brightness refer to the CIE-x, CIE-y and brightness differences relative to the angular position of 0°.

TABLE 4

| Weight Percentage Concentration of Uniform Light Particles added to LED Light Source (%) | −50° light color CIE-x color difference | 50° light color CIE-x color difference | −60° light color CIE-x color difference | 60° light color CIE-x color difference | −70° light color CIE-x color difference | 70° light color CIE-x color difference |
|---|---|---|---|---|---|---|
| 0 | 0.0005 | 0.0005 | 0.0009 | 0.0011 | 0.0012 | 0.0014 |
| 5 | 0.0003 | 0.0004 | 0.0003 | 0.0002 | 0.0006 | −0.0007 |
| 10 | 0.0003 | 0.0001 | 0.0003 | 0.0000 | 0.0005 | −0.0006 |
| 15 | 0.0002 | 0.0003 | 0.0003 | 0.0005 | 0.0004 | 0.0004 |

TABLE 5

| Weight Percentage Concentration of Uniform Light Particles added to LED Light Source (%) | −50° light color CIE-y color difference | 50° light color CIE-y color difference | −60° light color CIE-y color difference | 60° light color CIE-y color difference | −70° light color CIE-y color difference | 70° light color CIE-y color difference |
|---|---|---|---|---|---|---|
| 0 | 0.0007 | 0.0010 | 0.0013 | 0.0019 | 0.0017 | 0.0025 |
| 5 | −0.0003 | −0.0002 | 0.0003 | −0.0011 | 0.0010 | −0.0024 |
| 10 | 0.0006 | −0.0001 | 0.0008 | −0.0004 | −0.0001 | −0.0012 |
| 15 | 0.0001 | 0.0004 | −0.0003 | 0.0003 | −0.0001 | 0.0005 |

TABLE 6

| Weight Percentage Concentration of Uniform Light Particles added to LED Light Source (%) | 0° brightness (%) | −50° brightness (%) | 50° brightness (%) | −60° brightness (%) | 60° brightness (%) | −70° brightness (%) | 70° brightness (%) |
|---|---|---|---|---|---|---|---|
| 0 | 100.00 | 63.66 | 61.24 | 46.94 | 44.74 | 29.22 | 27.39 |
| 5 | 74.39 | 43.01 | 50.66 | 32.70 | 39.22 | 22.11 | 27.31 |
| 10 | 69.49 | 42.26 | 46.86 | 31.85 | 36.28 | 20.67 | 24.29 |
| 15 | 48.87 | 29.13 | 33.17 | 21.48 | 25.40 | 13.79 | 17.33 |

From the content of each table above, the higher the weight percentage concentration of the uniform light particles, the smaller the light color difference of the LED light source 1, and the lower the brightness. Therefore the uniform light particles 16 relative to the protection structure 15 has a weight percentage concentration falling within a range of 5%-15%, and thus complying with the requirements of brightness and light color uniformity, so as to further improve the light output performance of the LED light source 1.

Figure 9:
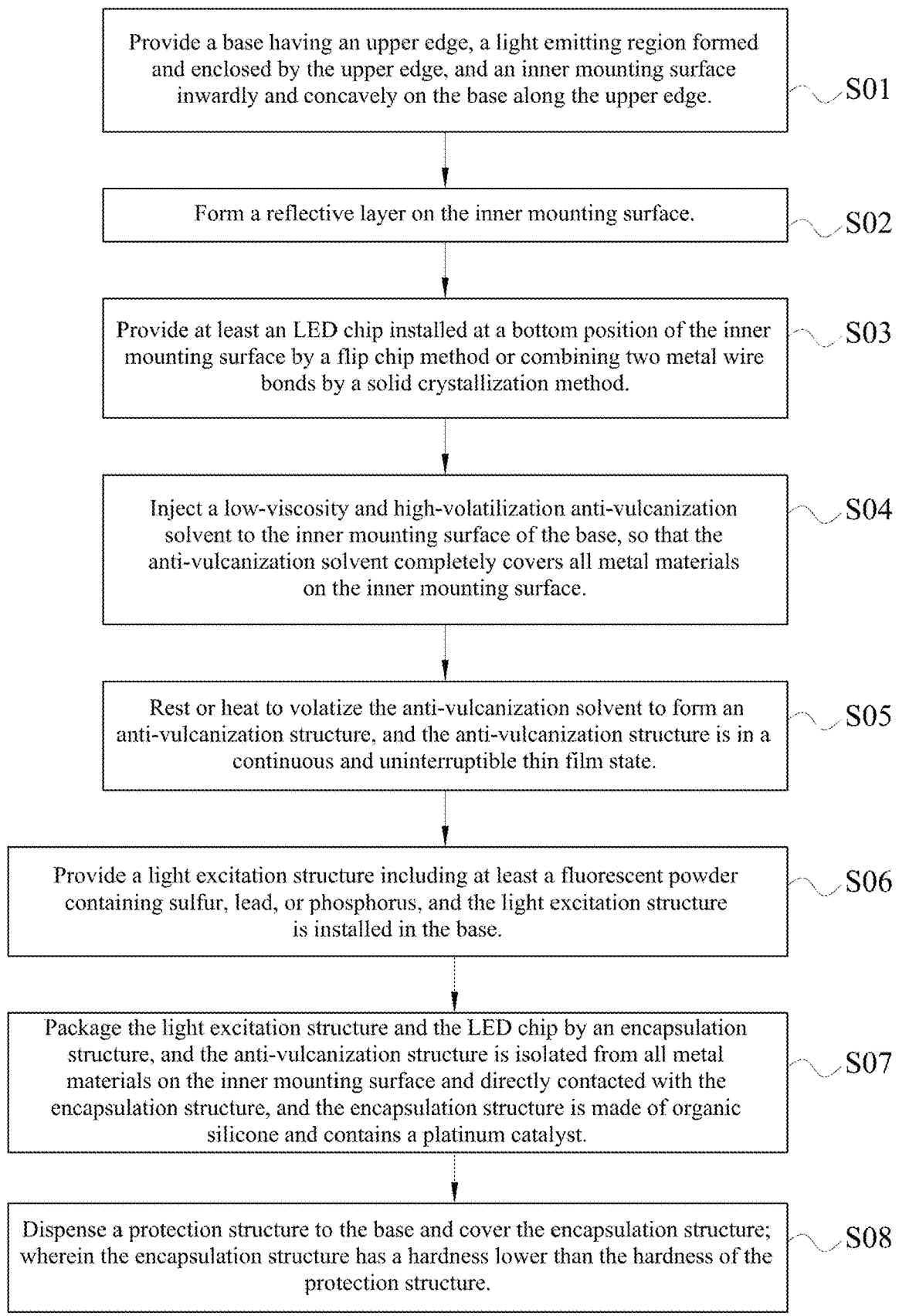
FIG. 9 is a flow chart of an LED light source manufacturing method of this disclosure.

With reference to FIG. 9 for the flow chart of an LED light source manufacturing method in accordance with this disclosure, and FIGS. 1 to 8 for the structure bundled with the LED light source, the LED light source manufacturing method for manufacturing the aforementioned LED light source comprises the following steps (S01-S08).

S01: Provide a base 10 having an upper edge 101, a light emitting region formed and enclosed by the upper edge 101, and an inner mounting surface 102 inwardly and concavely formed on the base 10 along the upper edge 101. Similarly, the light emitting region A does not refer to the light emission range of the LED light source 1, but it refers to the area enclosed by the upper edge 101 of the base 10.

S02: Form a reflective layer 1021 on the inner mounting surface 102.

S03: Provide at least an LED chip 11 installed at the bottom position of the inner mounting surface 102 by a flip chip method or combining two metal wire bonds by a solid crystallization method. The reflective layer 1021 is configured to cover the inner mounting surface 102, or some area o at the inner mounting surface 102 as needed, and the reflective layer 1021 after or before the LED chip 11 is installed, and the order of installation is not limited in this disclosure. The LED chip 11 is installed by the flip chip method or combined with the metal wire bonds 17. When the LED chip is installed by the flip chip method, the encapsulation structure 14 has a hardness preferably falling within a range of D40-D60, so that the encapsulation structure 14 can protect the light excitation structure 13 and the LED chip. If the LED chip 11 is installed by combining the metal wire bonds 17, the encapsulation structure 14 has a hardness preferably falling within a range of D20-D40 to prevent the encapsulation structure 14 from affecting the metal wire bonds 17. To enhance the light output performance of the LED light source 1, the base 10 is preferably made of a transparent material, so that the LED light source 1 has a multidirectional light output effect.

S04: Inject a low-viscosity and high-volatilization anti-vulcanization solvent to the inner mounting surface 102 of the base 10, so that the anti-vulcanization solvent completely covers all metal materials on the inner mounting surface 102.

S05: Rest or heat to volatize the anti-vulcanization solvent to form an anti-vulcanization structure 12, and the anti-vulcanization structure 12 is in a continuous and uninterruptible thin film state. Preferably, the anti-vulcanization solvent is a silicone solvent with a silicone content of approximately 2-3%, and the remaining part is a solvent selected from ethylacetate and toluene below 0.2%, and the anti-vulcanization solvent has the low-viscosity and high-volatilization characteristics. The anti-vulcanization structure 12 formed after the anti-vulcanization solvent is volatilized has a hardness preferably falling within a range of D70-D100, a water vapor transmission rate less than 10 g/m2.24 h, and an oxygen transmission rate less than 500 cm3/m2.24 h.atm. Wherein, if the anti-vulcanization solvent is volatilized by heating, the heating temperature is lower than 150° C., wherein a too-high heating temperature may cause the volatile gas not escaping timely before the film is cured and may result in the production of air bubbles or film cracks after the anti-vulcanization structure 12 is formed. If the LED chip 11 is installed by combining the metal wire bonds 17, to prevent the anti-vulcanization structure 12 with a high hardness from being too thick, so that the metal wire bonds 17 may be damaged during thermal expansion and contraction. Preferably, the anti-vulcanization structure 12 has a thickness falling within a range of 2-10 μm.

S06: Provide a light excitation structure including at least a fluorescent powder containing one selected from the group consisting of sulfur, lead, and phosphorus, and the light excitation structure 13 is installed in the base.

S07: Package the light excitation structure 13 and the LED chip 11 by an encapsulation structure 14, and the anti-vulcanization structure 12 isolates all metal materials on the inner mounting surface 102 from directly contacting with the encapsulation structure 14, and the encapsulation structure 14 is made of organic silicone and containing a platinum catalyst S08: Dispense a protection structure 15 to the base 10 and cover the encapsulation structure 14. Wherein, the encapsulation structure 14 has a hardness lower than the hardness of the protection structure 15. To combine the protection structure 15 with the encapsulation structure 14 securely and prevent the heterogeneous materials from affecting the light emission effect, the protection structure 15 may be made of a material selected from the organic silicone. To achieve the moisture and oxygen resisting performance, the protection structure 15 comes with a hardness falling within a range of D60-D80. The structure and technical characteristics of the LED light source 1 manufactured by the aforementioned method have been described in the above paragraphs and illustrated by FIGS. 1 to 8. Wherein, the protection structure 15 is installed at the upper edge 101 of the base 10 by a dispensing method and the protection structure 15 has an area greater than the area of the light emitting region A (as shown in FIGS. 1, 3, 4 and 6-7), or the upper edge 101 of the base 10 is formed into a stepped shape (as shown in FIGS. 5 and 8). These arrangements can effectively support the protection structure 15, so that the protection structure 15 will not press or damage the encapsulation structure 14 with a lower hardness.

The protection structure 15 further comprises a plurality of uniform light particles 16 scattered in the protection structure 15, wherein the uniform light particle 16 is selected from the group consisting of $SiO_2$, BN, $Al_2O_3$, and $TiO_2$ or a combination thereof, and the uniform light particles 16 are added to enhance the light color uniformity of the LED light source 1. Preferably, the uniform light particles 16 relative to the protection structure 15 has a weight percentage concentration falling within a range of 5%-15% to prevent the uniform light particles 16 with a too-low weight percentage concentration from causing a non-uniform light effect or the uniform light particles 16 with a too-high weight percentage concentration from causing an insufficient brightness. Please refer to the description above for the measurement results with regard to the light output performance of the uniform light particles 16 doped with different weight percentage concentrations.

In a specific application, the LED light source 1 may be configured in different ways and mixed to produce a white light. In FIG. 2 or 6, the LED chip 11 has a light emission wavelength falling within a range of 400-460 nm, and the light excitation structure 13 comprises a green fluorescent powder 131 and a first red fluorescent powder 132, and the green fluorescent powder 131 contains sulfur, and the first red fluorescent powder 132 does not contain sulfur. Wherein, the first red fluorescent powder 132 is selected from the group consisting of $T_2XF_6:Mn^{4+}$, $M_2Si_5N_8:Eu^{2+}$, and $CaAlSiN_3:Eu^{2+}$; T is an element selected from the group consisting of Li, Na, K, and Rb, and X is an element selected from the group consisting of Ge, Si, Sn, Zr, and Ti; M is an element selected from the group consisting of Ca, Sr, and Ba. Preferably, the green fluorescent powder 131 has a spectral half-wave width of 20-40 nm or 40-60 nm, and the first red fluorescent powder 132 has a spectral half-wave width falling within a range of 2-7 nm or 75-95 nm. The light emitted from the LED chip 11, the green light excited and emitted by the green fluorescent powder 131, and the red light and excited and emitted by the first red fluorescent powder 132 are mixed to form a white light. In FIG. 3 or 7, the LED chip 11 has a light emission wavelength falling within a range of 400-460 nm, and the light excitation structure 13 comprises a green fluorescent powder 131 and a second red fluorescent powder 133, and the green fluorescent powder 131 contains sulfur, and the second red fluorescent powder 133 also contains sulfur. Wherein, the second red fluorescent powder 133 is selected from the group consisting of $CaS:Eu^{2+}$, $SrS:Eu^{2+}$, $Ba_2ZnS_3:Mn^{2+}$, and a red quantum dot. Preferably, the green fluorescent powder 131 has a spectral half-wave width of 20-40 nm or 40-60 nm, and the second red fluorescent powder 133 has a spectral half-wave width of 20-40 nm or 55-75 nm. The sulfur-containing green fluorescent powder 131 and second red fluorescent powder 133 can enhance the light color performance of the LED light source 1. In FIG. 4, the LED chip 11 has a light emission wavelength falling within a range of 400-460 nm, and the light excitation structure 13 comprises a green fluorescent powder 131, a first red fluorescent powder 132 and a second red fluorescent powder 133, and the green fluorescent powder 131 contains sulfur, and the first red fluorescent powder 132 does not contain sulfur, and the second red fluorescent powder 133 contains sulfur. Wherein, the first red fluorescent powder 132 is selected from the group consisting of $T_2XF_6:Mn^{4+}$, $M_2Si_5N_8:Eu^{2+}$, and $CaAlSiN_3:Eu^{2+}$; T is an element selected from the group consisting of Li, Na, K, and Rb, and X is an element selected from the group consisting of Ge, Si, Sn, Zr, and Ti; and M is an element selected from the group consisting of Ca, Sr, and Ba, the second red fluorescent powder 133 is selected from the group consisting of $CaS:Eu^{2+}$, $SrS:Eu^{2+}$, $Ba_2ZnS_3:Mn^{2+}$, and a red quantum dot. Preferably, the green fluorescent powder 131 has a spectral half-wave width of 20-40 nm or 40-60 nm, and the first red fluorescent powder 132 has a spectral half-wave width of 2-7 nm or 75-95 nm, and the second red fluorescent powder 133 has a spectral half-wave width of 20-40 nm or 55-75 nm. By the configuration having two mixed red fluorescent powders, the afterimage of the red light can be reduced effectively to further improve the light output performance of the LED light source 1.

In FIG. 4, the LED chip 11 comes with a plural quantity, and the LED chips 11 include a chip with a light emission wavelength falling within a range of 400-460 nm and a green chip, and the light excitation structure 13 comprises a second red fluorescent powder 133, and the second red fluorescent powder 133 contains sulfur. Wherein, the second red fluorescent powder 133 is selected from the group consisting of $CaS:Eu^{2+}$, $SrS:Eu^{2+}$, $Ba_2ZnS_3:Mn^{2+}$, and a red quantum dot. Preferably, the second red fluorescent powder 133 has a spectral half-wave width of 20-40 nm or 55-75 nm. The LED light source 1 produces a white light by mixing the light of the LED chip 11, the red light excited and formed by the second red fluorescent powder 133, and provides a good white light expression. In FIGS. 5 and 8, the LED chip 11 comes with a plural quantity and the LED chips 11 include a chip with a light emission wavelength falling within a range of 400-460 nm and a green chip, and the light excitation structure 13 comprises a first red fluorescent powder 132 and a second red fluorescent powder 133, and the first red fluorescent powder 132 does not contain sulfur, and the second red fluorescent powder 133 contains sulfur. Wherein, the first red fluorescent powder 132 is selected from the group consisting of $T_2XF_6:Mn^{4+}$, $M_2Si_5N_8:Eu^{2+}$, and $CaAlSiN_3:Eu^{2+}$; T is an element selected from the group consisting of Li, Na, K, and Rb, and X is an element selected from the group consisting of Ge, Si, Sn, Zr, and Ti; M is an element selected from the group consisting of Ca, Sr, and Ba, and the second red fluorescent powder 133 is selected from the group consisting of is selected from the group consisting of $CaS:Eu^{2+}$, $SrS:Eu^{2+}$, $Ba_2ZnS_3:Mn^{2+}$, and a red quantum dot. Preferably, the first red fluorescent powder 132 has a spectral half-wave width falling within a range of 2-7 nm or 75-95 nm, and the second red fluorescent powder 133 has a spectral half-wave width of 20-40 nm or 55-75 nm. The sulfur-containing or non-sulfur-containing red fluorescent powder can effectively reduce the afterimage caused by the red light and improve the light output performance of the LED light source 1. Besides the aforementioned materials, the materials described in the embodiments above may be used as the green fluorescent powder 131, the first red fluorescent powder 132 and the second red fluorescent powder 133.

Figure 10:
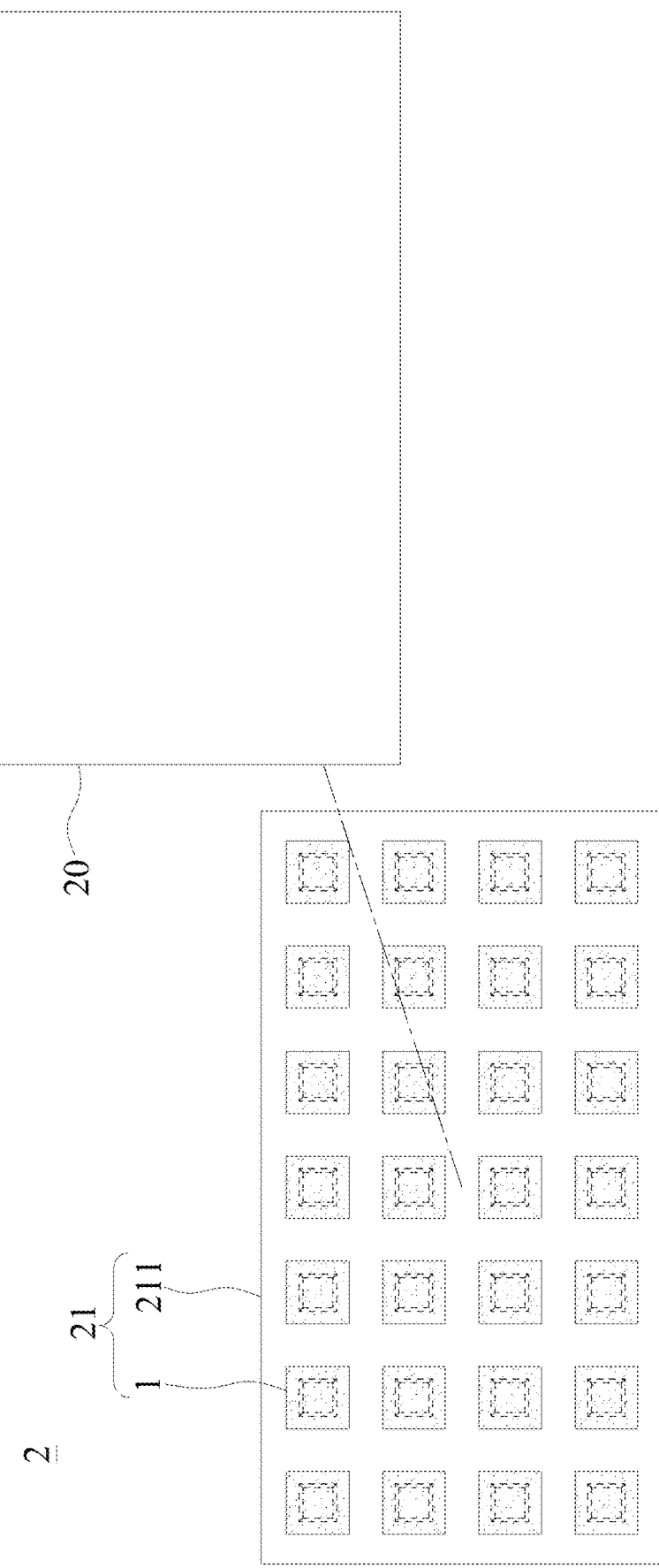
FIG. 10 is an exploded view of a direct display device of this disclosure.

The LED light source 1 manufactured by the aforementioned manufacturing method and the conventional LED 9 are compared, and the experiment and comparison results are similar to those listed in Tables 1 to 3, so that the LED light source 1 manufactured by this method can effectively improve the light emission brightness and the light color attenuation during the LED manufacturing process in a high-temperature furnace by the SMTRST. On the other hand, Tables 4 to 6 and the corresponding contents may be used as a reference of the output light color and brightness result and the overall uniformity of the output light color distribution detected at different angles after the uniform light particles 16 of different weight percentage concentrations are added. The detected results show that the uniformity of the light color distribution of the LED light source 1 can be enhanced effectively after the uniform light particles 16 are added With reference to FIG. 10 for an exploded view of a direct display device of this disclosure as well as FIGS. 1 to 8, the direct display device 2 comprises a display module 20 and a backlight module 21, and the backlight module 21 is installed on a side of the display module 20 and includes a circuit board 211 and a plurality of LED light sources 1. The LED light sources 1 are installed on the circuit board 211 and comprise a base 10, at least an LED chip 11, an anti-vulcanization structure 12, a light excitation structure 13, an encapsulation structure 14 and a protection structure 15. The structure and connection of each of the LED light sources 1 have been described above, and thus will not be repeated. Wherein, the LED chip 11 is installed at the bottom position of the inner mounting surface 102 by a flip chip method, or a method of combining two metal wire bonds 17. When the LED chip 11 is installed by the flip chip method, the anti-vulcanization structure 12 is continuously and uninterruptible formed at the reflective layer 1021 and a surface of the LED chip 11; and when the LED chip 11 is installed by the method of combining the metal wire bonds 17, the anti-vulcanization structure 12 is continuously and uninterruptible formed at the reflective layer 1021, the metal wire bonds 17 and a surface of the LED chip 11, so as to protect the metal material in the base 10 and prevent them from being affected by the sulphur composition to produce vulcanization. Please refer to the content of the embodiments above for the same remaining technical characteristics If the LED applied to a conventional direct display device has a too-large deviation of its output light color, optical components such as lenses are required to be added to the LED by secondary optics. As a result, the required cost and the difficulty of assembling the components are increased, and LED may have a yellow-ring light output caused by the secondary optical amplification effect of the lenses. Further, a dense arrangement of LEDs may overcome the large deviation of the light color, but the LED situated at a too-close position may cause a hot-spot light output and non-uniform brightness. In summation of the contents of the aforementioned embodiments, the light excitation structure containing sulfur, lead, or phosphorus can be packaged into the LED light source 1 perfectly, and the vulcanization of the metal material in the base 10 caused by the sulphur composition can be reduced. In addition, the protection structure 15 can effectively overcome the issues of the catalyst poison caused by the aforementioned compositions and the insufficient hardness of the encapsulation structure 14 to improve the light color performance and the light output performance of the LED light source 1. Since the single LED light source 1 can provide an excellent light output performance, therefore the LED light source 1 applied to the direct display device 2 has an excellent light output effect, and the required quantity of the LED light sources 1 can be reduced significantly and the manufacturing cost can be lowered effectively. This disclosure also reduces the different color phenomenon, allows the direct display device 2 to have a high contrast screen, and prevent non-uniform colors in a single area, so as to enhance the light output quality greatly Preferably, each of the LED light sources 1 further comprises a plurality of uniform light particles 16 distributed in the protection structure 15, and the uniform light particle 16 is selected from the group consisting of $SiO_2$, BN, $Al_2O_3$, and $TiO_2$ or a combination thereof. Preferably, the uniform light particles relative to the protection structure has a weight percentage concentration falling within a range of 5%-15%. The addition of the uniform light particles 16 further enhances the uniformity of the light color distribution of the output light of the LED light sources 1, and the direct display device 2 can further eliminate the different color issue to provide a product with better light color distribution performance. Please refer to Tables 4 to 6, and the corresponding contents of the first embodiment for the light color after the uniform light particles 16 are added and the brightness testing result.

Please refer to the aforementioned embodiments for additional technical characteristics of the direct display device 2. For example, the protective material 15 may be one selected organic silicone to improve the bonding strength of the encapsulation structure 14 and prevent the heterogeneous materials from affecting the optics. To achieve a good moisture and oxygen resisting performance, the protection structure comes with a hardness falling within a range of D60-D80. To improve the light output performance of the LED light source 1, the base 10 is made of a transparent material. To prevent the protection structure 15 from pressing and damaging the encapsulation structure 14 with a lower hardness, the protection structure 15 is installed at the upper edge 101 of the base 10 by a dispensing method, and the protection structure 15 has an area greater than the area of the light emitting region A. Further, the upper edge 101 of the base 10 is formed in a stepped shape to facilitate the installation of the protection structure 15. When the LED chip 11 is installed by a flip chip method, the encapsulation structure 14 has a hardness preferably falling within a range of D40-D60; and when the LED chip 11 is installed by the method of combining the metal wire bonds 17, the encapsulation structure 14 has a hardness preferably falling within a range of D20-D40. The remaining technical characteristics have been described in details above, and thus will not be repeated.

In a specific application, each of the LED light sources 1 of the direct display device is shown in FIG. 2 or 5, and the LED chip 11 has a light emission wavelength falling within a range of 400-460 nm, and the light excitation structure 13 comprises a green fluorescent powder 131 and a first red fluorescent powder 132, and the green fluorescent powder 131 contains sulfur, and the first red fluorescent powder 132 does not contain sulfur. Wherein, the first red fluorescent powder 132 is selected from the group consisting of $T_2XF_6$:$Mn^{4+}$, $M_2Si_5N_8$:$Eu^{2+}$, and $CaAlSiN_3$:$Eu^{2+}$; T is an element selected from the group consisting of Li, Na, K, and Rb, and X is an element selected from the group consisting of Ge, Si, Sn, Zr, and Ti; M is an element selected from the group consisting of Ca, Sr, and Ba. Preferably, the green fluorescent powder 131 has a spectral half-wave width of 20-40 nm or 40-60 nm, and the first red fluorescent powder 132 has a spectral half-wave width falling within a range of 2-7 nm or 75-95 nm. The light of the LED chip 11, the green light excited and emitted by the green fluorescent powder 131, and the red light excited and formed by the first red fluorescent powder 132 are mixed to form a white light. In FIG. 3 or 7, the LED chip 11 has a light emission wavelength falling within a range of 400-460 nm, and the light excitation structure 13 comprises a green fluorescent powder 131 and a second red fluorescent powder 133, and the green fluorescent powder 131 contains sulfur, and the second red fluorescent powder 133 also contains sulfur. Wherein, the second red fluorescent powder 133 is selected from the group consisting of CaS:$Eu^{2+}$, SrS:$Eu^{2+}$, $Ba_2ZnS_3$:$Mn^{2+}$, and a red quantum dot. Preferably, the green fluorescent powder 131 has a spectral half-wave width of 20-40 nm or 40-60 nm, and the second red fluorescent powder 133 has a half-wave width of 20-40 nm or 55-75 nm. The sulfur-containing green fluorescent powder 131 and second red fluorescent powder 133 can improve the light color performance of the LED light source 1. Alternatively, the LED chip 11 has a light emission wavelength falling within a range of 400-460 nm, and the light excitation structure 13 comprises a green fluorescent powder 131, a first red fluorescent powder 132 and a second red fluorescent powder 133, and the green fluorescent powder 131 contains sulfur, and the first red fluorescent powder 132 does not contain sulfur, and the second red fluorescent powder 133 contains sulfur. Wherein, the first red fluorescent powder 132 is selected from the group consisting of $T_2XF_6$:$Mn^{4+}$, $M_2Si_5N_8$:$Eu^{2+}$, and $CaAlSiN_3$:$Eu^{2+}$; T is an element selected from the group consisting of Li, Na, K, and Rb, and X is an element selected from the group consisting of Ge, Si, Sn, Zr, and Ti; M is an element selected from the group consisting of Ca, Sr, and Ba, the second red fluorescent powder 133 is selected from the group consisting of CaS:$Eu^{2+}$, SrS:$Eu^{2+}$, $Ba_2ZnS_3$:$Mn^{2+}$, and a red quantum dot. Preferably, the green fluorescent powder 131 has a spectral half-wave width of 20-40 nm or 40-60 nm, the first red fluorescent powder 132 has a spectral half-wave of 2-7 nm or 75-95 nm, and the second red fluorescent powder 133 has a spectral half-wave width of 20-40 nm or 55-75 nm. The configuration by mixing two types of red fluorescent powders can effectively reduce the afterimage caused by the red light and improve the light output performance of the LED light source 1.

In FIG. 4, the LED chip 11 comes with a plural quantity, and the LED chips 11 include a chip with a light emission wavelength falling within a range of 400-460 nm and a green chip, and the light excitation structure 13 comprises a second red fluorescent powder 133, and the second red fluorescent powder 133 contains sulfur. Wherein, the second red fluorescent powder 133 is selected from the group consisting of CaS:$Eu^{2+}$, SrS:$Eu^{2+}$, $Ba_2ZnS_3$:$Mn^{2+}$, and a red quantum dot. Preferably, the second red fluorescent powder 133 has a spectral half-wave width of 20-40 nm or 55-75 nm. The LED light source 1 can mix the light emitted by the LED chip 11 and the red light excited and emitted by the second red fluorescent powder 133 to produce a white light, so that the LED light source 1 has a good white light expression. In FIGS. 5 and 8, when the LED chip 11 comes with a plural quantity and the LED chips 11 include a blue chip and a green chip, the light excitation structure 13 comprises a first red fluorescent powder 132 and a second red fluorescent powder 133, and the first red fluorescent powder 132 does not contain sulfur, and the second red fluorescent powder 133 contains sulfur. Wherein, the first red fluorescent powder 132 is selected from the group consisting of $T_2XF_6$:$Mn^{4+}$, $M_2Si_5N_8$:$Eu^{2+}$, and $CaAlSiN_3$:$Eu^{2+}$; T is an element selected from the group consisting of Li, Na, K, and Rb, and X is an element selected from the group consisting of Ge, Si, Sn, Zr, and Ti; M is an element selected from the group consisting of Ca, Sr, and Ba, the second red fluorescent powder 133 is selected from the group consisting of CaS:

$Eu^{2+}$, $SrS:Eu^{2+}$, $Ba_2ZnS_3:Mn^{2+}$, and a red quantum dot. Preferably, the first red fluorescent powder 132 has a spectral half-wave width of 2-7 nm or 75-95 nm, and the second red fluorescent powder 133 has a spectral half-wave width of 20-40 nm or 55-75 nm. The sulfur-containing or non-sulfur-containing red fluorescent powder can effectively reduce the afterimage caused by the red light and improve the light output performance of the LED light source 1. Besides the materials described above, the green fluorescent powder 131, the first red fluorescent powder 132 and the second red fluorescent powder 133 may be any material described in the embodiments above, and thus will not be repeated.

In summation of the description above, this disclosure discloses an LED light source, an LED light source manufacturing method and their direct display device, and the LED light source can package the fluorescent powder containing sulfur, lead, or phosphorus and having a good light color performance and use the continuous and uninterruptible anti-vulcanization structure to effectively eliminate the vulcanization of the metal material caused by the sulphur composition. Since the encapsulation structure produces a catalyst poison due to the aforementioned compositions, the protection issue of the LED chip and the light excitation structure can be overcome by the protection structure effectively. The protection structure allows the encapsulation structure with a lower hardness to package and fix the light excitation structure and the LED chip without worrying about a too-low hardness that reduces the protection performance for the moisture and oxygen resistance and improves the light color expression and the light output performance of the LED light source. When the LED light source is applied to a direct display device, the quantity of LED light sources of this disclosure can be reduced significantly to lower the material and manufacturing costs, while reducing the different color phenomenon to improve the light output quality.

What is claimed is:

1. An LED light source manufacturing method, comprising the steps of:
   providing a base having an upper edge, a light emitting region formed and enclosed by the upper edge, and an inner mounting surface inwardly and concavely formed on the base along the upper edge;
   forming a reflective layer on the inner mounting surface;
   providing at least an LED chip installed at a bottom position of the inner mounting surface by a flip chip method or combining two metal wire bonds by a solid crystallization method;
   injecting a low-viscosity and high-volatilization anti-vulcanization solvent to the inner mounting surface of the base, so that the anti-vulcanization solvent completely covers all metal materials on the inner mounting surface;
   resting or heating to volatize the anti-vulcanization solvent to form an anti-vulcanization structure, and the anti-vulcanization structure being in a continuous and uninterruptible thin film state;
   providing a light excitation structure including at least a fluorescent powder containing one selected from the group consisting of sulfur, lead, and phosphorus, and the light excitation structure being installed in the base;
   packaging the light excitation structure and the LED chip by an encapsulation structure, and the anti-vulcanization structure isolating all metal materials on the inner mounting surface from directly contacting with the encapsulation structure, and the encapsulation structure being made of organic silicone and containing a platinum catalyst; and
   dispensing a protection structure to the base and covering the encapsulation structure; wherein the encapsulation structure has a hardness lower than a hardness of the protection structure,
   wherein the protection structure further comprises a plurality of uniform light particles scattered in the protection structure, and the uniform light particle is selected from the group consisting of $SiO_2$, BN, $Al_2O_3$, and $TiO_2$ or a combination thereof,
   the LED chip has a light emission wavelength falling within a range of 400-460 nm, and the light excitation structure comprises a green fluorescent powder, a first red fluorescent powder and a second red fluorescent powder, and the green fluorescent powder contains sulfur, and the first red fluorescent powder does not contain sulfur, and the second red fluorescent powder contains sulfur; the first red fluorescent powder is selected from the group consisting of $T_2XF_6:Mn^{4+}$, $M_2Si_5N_8:Eu^{2+}$, and $CaAlSiN_3:Eu^{2+}$; T is selected from the group consisting of Li, Na, K, and Rb, and X is selected from the group consisting of Ge, Si, Sn, Zr, and Ti; and M is selected from the group consisting of Ca, Sr, and Ba; and the second red fluorescent powder is selected from the group consisting of $CaS:Eu^{2+}$, $SrS:Eu^{2+}$, $Ba_2ZnS_3:Mn^{2+}$, and a red quantum dot.

2. The LED light source manufacturing method of claim 1, wherein the uniform light particle relative to the protection structure has a weight percentage concentration falling within a range of 5%-15%.

3. The LED light source manufacturing method of claim 2, wherein the protection structure is made of a material selected from organic silicone.

4. The LED light source manufacturing method of claim 3, wherein the encapsulation structure has a hardness preferably falling within a range of D40-D60 when the LED chip is installed at a bottom position of the inner mounting surface by a flip chip method.

5. The LED light source manufacturing method of claim 4, wherein the protection structure has a hardness falling within a range of D60-D80.

6. The LED light source manufacturing method of claim 5, wherein when the anti-vulcanization solvent is heated and volatilized, the heating temperature is lower than 150° C.

7. The LED light source manufacturing method of claim 6, wherein the base is made of a transparent material.

8. The LED light source manufacturing method of claim 7, wherein the protection structure is installed at the upper edge of the base by a dispensing method, and the protection structure has an area greater than an area of the light emitting region.

9. The LED light source manufacturing method of claim 8, wherein the upper edge of the base is formed into a stepped shape.

10. The LED light source manufacturing method of claim 3, wherein the encapsulation structure has a hardness preferably falling within a range of D20-D40 when the LED chip is installed at a bottom position of the inner mounting surface by a solid crystallization of the metal wire bonds.

11. The LED light source manufacturing method of claim 10, wherein the protection structure has a hardness falling within a range of D60-D80.

12. The LED light source manufacturing method of claim 11, wherein the anti-vulcanization structure has a thickness falling within a range of 2-10 μm.

13. The LED light source manufacturing method of claim 12, wherein when the anti-vulcanization solvent is heated and volatilized, the heating temperature is lower than 150° C.

14. The LED light source manufacturing method of claim 13, wherein the base is made of a transparent material.

15. The LED light source manufacturing method of claim 14, wherein the protection structure is installed at the upper edge of the base by a dispensing method, and the protection structure has an area greater than an area of the light emitting region.

16. The LED light source manufacturing method of claim 15, wherein the upper edge of the base is formed into a stepped shape.

17. An LED light source manufacturing method, comprising the steps of:
providing a base having an upper edge, a light emitting region formed and enclosed by the upper edge, and an inner mounting surface inwardly and concavely formed on the base along the upper edge;
forming a reflective layer on the inner mounting surface;
providing at least an LED chip installed at a bottom position of the inner mounting surface by a flip chip method or combining two metal wire bonds by a solid crystallization method;
injecting a low-viscosity and high-volatilization anti-vulcanization solvent to the inner mounting surface of the base, so that the anti-vulcanization solvent completely covers all metal materials on the inner mounting surface;
resting or heating to volatize the anti-vulcanization solvent to form an anti-vulcanization structure, and the anti-vulcanization structure being in a continuous and uninterruptible thin film state;
providing a light excitation structure including at least a fluorescent powder containing one selected from the group consisting of sulfur, lead, and phosphorus, and the light excitation structure being installed in the base;
packaging the light excitation structure and the LED chip by an encapsulation structure, and the anti-vulcanization structure isolating all metal materials on the inner mounting surface from directly contacting with the encapsulation structure, and the encapsulation structure being made of organic silicone and containing a platinum catalyst and dispensing a protection structure to the base and covering the encapsulation structure;
wherein the encapsulation structure has a hardness lower than a hardness of the protection structure,
wherein the protection structure further comprises a plurality of uniform light particles scattered in the protection structure, and the uniform light particle is selected from the group consisting of $SiO_2$, BN, $Al_2O_3$, and $TiO_2$ or a combination thereof,
the LED chip comes with a plural quantity, and the LED chips include a chip with a light emission wavelength falling within a range of 400-460 nm and a green chip, and the light excitation structure includes a second red fluorescent powder, and the second red fluorescent powder contains sulfur; and the second red fluorescent powder is selected from the group consisting of CaS:$Eu^{2+}$, SrS:$Eu^{2+}$, $Ba_2ZnS_3$:$Mn^{2+}$, and a red quantum dot.

18. The LED light source manufacturing method of claim 17, wherein the uniform light particle relative to the protection structure has a weight percentage concentration falling within a range of 5%-15%.

19. The LED light source manufacturing method of claim 18, wherein the protection structure is made of a material selected from organic silicone.

20. An LED light source manufacturing method, comprising the steps of:
providing a base having an upper edge, a light emitting region formed and enclosed by the upper edge, and an inner mounting surface inwardly and concavely formed on the base along the upper edge;
forming a reflective layer on the inner mounting surface;
providing at least an LED chip installed at a bottom position of the inner mounting surface by a flip chip method or combining two metal wire bonds by a solid crystallization method;
injecting a low-viscosity and high-volatilization anti-vulcanization solvent to the inner mounting surface of the base, so that the anti-vulcanization solvent completely covers all metal materials on the inner mounting surface;
resting or heating to volatize the anti-vulcanization solvent to form an anti-vulcanization structure, and the anti-vulcanization structure being in a continuous and uninterruptible thin film state;
providing a light excitation structure including at least a fluorescent powder containing one selected from the group consisting of sulfur, lead, and phosphorus, and the light excitation structure being installed in the base;
packaging the light excitation structure and the LED chip by an encapsulation structure, and the anti-vulcanization structure isolating all metal materials on the inner mounting surface from directly contacting with the encapsulation structure, and the encapsulation structure being made of organic silicone and containing a platinum catalyst and dispensing a protection structure to the base and covering the encapsulation structure;
wherein the encapsulation structure has a hardness lower than a hardness of the protection structure, wherein the protection structure further comprises a plurality of uniform light particles scattered in the protection structure, and the uniform light particle is selected from the group consisting of $SiO_2$, BN, $Al_2O_3$, and $TiO_2$ or a combination thereof,
the LED chip comes with a plural quantity, and the LED chips include a chip with a light emission wavelength falling within a range of 400-460 nm and a green chip, and the light excitation structure comprises a first red fluorescent powder and a second red fluorescent powder, and the first red fluorescent powder does not contain sulfur, and the second red fluorescent powder contains sulfur; and the first red fluorescent powder is selected from the group consisting of $T_2XF_6$:$Mn^{4+}$, $M_2Si_5N_8$:$Eu^{2+}$, and $CaAlSiN_3$:$Eu^{2+}$; T is an element selected from the group consisting of Li, Na, K, and Rb; X is an element selected from the group consisting of Ge, Si, Sn, Zr and Ti; M is an element selected from the group consisting of Ca, Sr, and Ba; and the second red fluorescent powder is selected from the group consisting of CaS:$Eu^{2+}$, SrS:$Eu^{2+}$, $Ba_2ZnS_3$:$Mn^{2+}$, and a red quantum dot.

21. The LED light source manufacturing method of claim 20, wherein the uniform light particle relative to the protection structure has a weight percentage concentration falling within a range of 5%-15%.

22. The LED light source manufacturing method of claim 21, wherein the protection structure is made of a material selected from organic silicone.

* * * * *